US011533034B2

(12) United States Patent
Zhao et al.

(10) Patent No.: US 11,533,034 B2
(45) Date of Patent: Dec. 20, 2022

(54) CURRENT MONITORING AND AMPLIFIER GAIN CONTROL

(71) Applicant: Infineon Technologies Austria AG, Villach (AT)

(72) Inventors: Tao Zhao, Redondo Beach, CA (US); Pablo Yelamos Ruiz, Hermosa Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 128 days.

(21) Appl. No.: 17/028,101

(22) Filed: Sep. 22, 2020

(65) Prior Publication Data

US 2022/0094321 A1    Mar. 24, 2022

(51) Int. Cl.
*H03G 3/30* (2006.01)
*H03G 3/00* (2006.01)

(52) U.S. Cl.
CPC ........... *H03G 3/3042* (2013.01); *H03G 3/004* (2013.01); *H03G 3/3026* (2013.01)

(58) Field of Classification Search
CPC ..... H03F 3/45; H03F 3/45183; H03G 1/0023; H03G 1/0088; H03G 3/45098; H03G 3/3042; H03G 3/004; H03G 3/3026; G01R 1/203; G01R 31/346; G01R 19/0092; H02P 25/03; H02P 29/40; H02P 25/022
USPC ........................................ 330/254, 278, 279
See application file for complete search history.

(56) References Cited

U.S. PATENT DOCUMENTS

| | | | | |
|---|---|---|---|---|
| 6,344,720 B1 * | 2/2002 | Koski | ..................... | H02P 6/085 318/722 |
| 7,122,980 B2 * | 10/2006 | Kuroshima | ............... | H02P 6/21 318/400.11 |
| 8,513,950 B2 | 8/2013 | Tanabe | | |
| 10,819,257 B1 * | 10/2020 | Khosravi | ................ | H02P 6/153 |
| 2010/0073090 A1 * | 3/2010 | Mattos | ..................... | H03F 1/52 327/51 |

(Continued)

FOREIGN PATENT DOCUMENTS

| | | |
|---|---|---|
| EP | 2388598 A2 | 11/2011 |
| EP | 2388598 A3 | 3/2016 |
| JP | 2017009423 A | 1/2017 |

OTHER PUBLICATIONS

Extended European Search Report; EP 21 19 8141, dated Feb. 4, 2022, pp. 1-11.

*Primary Examiner* — Khanh V Nguyen
(74) *Attorney, Agent, or Firm* — Armis IP Law, LLC

(57) ABSTRACT

An apparatus includes a controller that controls operation of an amplifier. The amplifier receives a sample voltage produced by a resistive path; the sample voltage from the resistive path is indicative of a magnitude of current through a motor winding. The controller selects a gain setting to apply to the amplifier based on one or more conditions. The selected gain setting is selected amongst multiple possible gain settings. Subsequent to selection, via application of the selected gain setting to the amplifier, and based on an output of the amplifier, the controller monitors a magnitude of the current through the motor winding. According to one configuration, the amplifier adjusts the magnitude of the selected gain setting depending on one or more parameters such as the magnitude of the current through the motor winding, a selected operational range of controlling current through the motor winding, etc.

30 Claims, 19 Drawing Sheets

(56) References Cited

U.S. PATENT DOCUMENTS

2017/0288622 A1\* 10/2017 Tan .................... G11C 29/028
2017/0366098 A1  12/2017 Gong et al.

\* cited by examiner

CURRENT MONITORING AND AMPLIFIER GAIN CONTROL

BACKGROUND

Shunt current sensing is a simple, relatively inexpensive and widely used in digital motor control such as in, for example, power tool applications. To reduce the power dissipation at high current sensing, the shunt resistance value typically is sized to be very small (e.g., less than 0.5 milliohms [0.5 mΩ]), which makes it challenging for accurate current sensing over a wide current range, especially when the current is small at low speed or light load.

For motor control in power tool applications, there is a trend to implement a so-called electronic clutch (a.k.a., E-clutch) instead of a mechanical clutch to set and limit the torque (and current) provided by a motor. In such applications, a current sensing strategy is implemented to sense a wide range of current using the same current sensing resistor, ADC (Analog-to-Digital Converter) reference voltage, and power supply.

One way to increase a resolution or accuracy of detecting a magnitude of current through a motor winding is to increase a respective ADC (Analog to Digital Converter) resolution, such as from an 8-bit or 10-bit ADC to a 12-bit. In certain instances, this does not solve a problem of increasing an accuracy of measuring a respective current through a motor winding.

BRIEF DESCRIPTION

This disclosure includes the observation that conventional techniques of monitoring current through a motor winding suffer from deficiencies. For example, as previously discussed, it is often difficult but desirable to more precisely sense a magnitude of current through a motor winding over a wide range of possible current settings.

Embodiments herein include novel ways of improving an accuracy of determining a magnitude of current through a motor winding. For example, embodiments herein implement variable gain amplifiers and changing of gain on-the-fly to ensure maximum resolution of the measurement at each current range condition, such as at different electronic clutch settings, load level, etc. Such embodiments support a wide range of motor current and provide more accurate determination of motor winding current.

More specifically, embodiments herein include an apparatus and/or system including a controller. The controller is operative to control operation of an amplifier that receives a sample voltage produced by a resistive path; the sample voltage from the resistive path is indicative of a magnitude of current through a motor winding. To more accurately determine a magnitude of current through the motor winding, the controller selects an appropriate gain setting to apply to the amplifier. The selected gain setting is selected amongst multiple possible gain settings. Subsequent to selection, via application of the selected gain setting to the amplifier and based on an output (amplified sample voltage) of the amplifier, the controller determines and monitors a magnitude of the current through the motor winding.

In one embodiment, the amplifier adjusts the magnitude of the selected gain setting applied to the amplifier depending on one or more parameters such as the magnitude of the current through the motor winding, a selected operational range of controlling current through the motor winding, etc.

Further embodiments herein include, via the controller, varying the selected gain of the amplifier depending on the magnitude of the current being supplied by the motor winding through the resistive path.

Still further embodiments herein include, via the controller, controlling a magnitude of the current through the motor winding via control input received from a user operating a tool including the motor winding.

In still further example embodiments, the controller receives a current limit value indicating a maximum amount of current in which to drive the motor winding. The controller selects the gain setting of the amplifier depending on the current limit value.

The resistive path as described herein can be in any suitable. For example, in one embodiment, the resistive path is a resistor disposed in series with the motor winding. Alternatively, the resistive path is an ON resistance between nodes of a switch through which the current passes through the motor winding.

In one embodiment, the controller implements hysteresis between a first gain applied to the amplifier and a second gain applied to the amplifier during operations of measuring different magnitudes of the current.

Further embodiments herein include, via the controller, controlling operation of a switch disposed in series with the motor winding. The controller adjusts the gain of the amplifier depending on a selected mode/operational range in which the current through the motor winding is selectable via a respective user.

In still further example embodiments, the controller increases a gain of the amplifier in response to detecting a decreased operational range of selectively controlling the current through the motor winding; the controller decreases a gain of the amplifier in response to detecting an increased operational range of selectively controlling the current through the motor winding.

Still further embodiments herein include, via the controller, decreasing a magnitude of the selected gain of the amplifier in response to detecting an increase in the magnitude of the current through the motor winding; and increasing the magnitude of the selected gain of the amplifier in response to detecting a decrease in the magnitude of the current through the motor winding.

In yet further example embodiments, controller controls and monitors current through each of multiple windings of a motor. For example, the controller applies a respective selected gain setting to each of the multiple amplifiers, the respective selected gain setting being chosen from the multiple gain settings. Via amplification of a respective sample voltage using the selected gain setting, the controller monitors a magnitude of respective current through each of the motor windings.

In still further example embodiments, the system as described herein includes multiple amplifiers (such as a first amplifier and a second amplifier) coupled to receive the sample voltage from the resistive path. The controller applies a first gain to the first amplifier and a second gain to a second amplifier. The controller selects between an output of the first amplifier and an output of the second amplifier to determine the magnitude of the current through the motor winding.

As previously discussed, embodiments herein are useful over conventional techniques. For example, embodiments herein include implementing variable gain control techniques to more accurately determine a magnitude of current through a motor winding.

These and other more specific embodiments are disclosed in more detail below.

Note that although embodiments as discussed herein are applicable to current monitoring and motor control, the concepts disclosed herein may be advantageously applied in any suitable application.

Note further that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: select a gain setting amongst multiple gain settings; apply the selected gain setting to an amplifier, the amplifier operative to receive a sample voltage produced by a resistive path, the sample voltage indicative of a magnitude of current through a motor winding; and monitor a magnitude of the current through the motor winding based on an output of the amplifier.

The ordering of the steps above has been added for clarity sake. Note that any of the processing operations as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing different gain control implementations to deliver current to a load such as a motor winding that supplies torque. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

Figure 1:
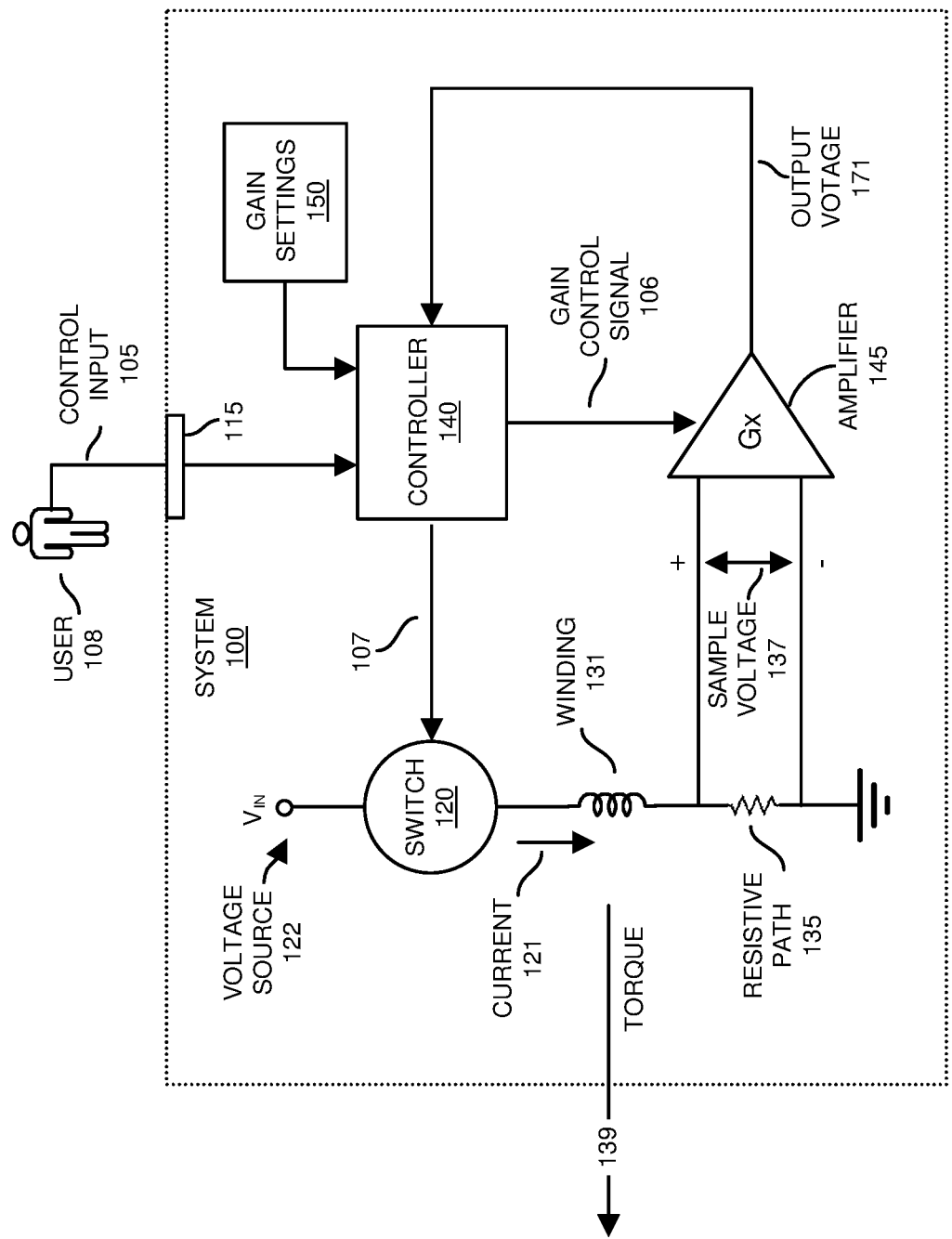
FIG. 1 is an example general diagram of a current monitoring and control system according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

An apparatus (such as a power tool or other type of device) includes a controller that controls operation of an amplifier and current through a winding. The amplifier receives a sample voltage produced by a resistive path; the sample voltage from the resistive path is indicative of a magnitude of current through a winding (such as motor winding, inductor, etc.). The controller selects a gain setting to apply to the amplifier based on one or more operational conditions associated with the apparatus. The selected gain setting is selected amongst multiple possible gain settings. Subsequent to selection, via application of the selected gain setting to the amplifier, and based on an output of the amplifier, the controller monitors a magnitude of the current through the motor winding. According to one configuration, the amplifier adjusts the magnitude of the selected gain setting depending on one or more parameters such as the magnitude of the current through the motor winding, a selected operational range of controlling current through the motor winding, a limit of current through the winding, etc.

Thus, in general, embodiments herein include use of one or more variable gain amplifiers and/or changing amplifier gain on-the-fly to ensure maximum resolution of the measurement at each current range condition associated with the respective winding, such as at different electronic clutch settings or load levels, all while supporting a wide range of motor winding currents.

Now, more specifically, FIG. 1 is an example general diagram of a current monitoring and control system according to embodiments herein.

In this simplified example embodiment, the system 100 (motor system or other suitable type system including one or more windings) includes controller 140, amplifier 145, switch 120, winding 131, and resistive path 135.

As shown, amplifier 145 receives the sample voltage 137 across resistive path 135 to produce corresponding output voltage 171 indicative of a magnitude of the current 121 through the winding 131. In one embodiment, the controller 140 includes one or more analog-to-digital converter operative to convert respective received output voltages into respective digital from for further processing.

In one embodiment, a magnitude of the output voltage 171 is equal to a magnitude of the sample voltage 137 across resistive path 135 multiplied by the selected gain Gx of the amplifier 145. The sample voltage 137 is equal to the magnitude of the current 121 multiplied by the resistance of the resistive path 135. Thus, current 121=output voltage 171/(gain $Gx$ times $R$),
where $R$=the resistance of the resistive path 135

In accordance with further example embodiments, the controller 140 controls operation associated with the winding 131. For example, the sample voltage 137 from the resistive path 135 is indicative of a magnitude of current 121 through the winding 131 (such as a motor winding, inductor, etc.); the controller 140 controls an amount of current 121 through the winding 131 (via control of the switch 120) depending on the control input 105 provided by the user 108 via user interface 115.

To more accurately determine a magnitude of current 121 through the winding 131, the controller 140 selects an appropriate gain setting (such as Gx) to apply to the amplifier 145 depending on operating conditions. In one embodiment, the controller 140 selects the gain setting Gx from multiple possible gain settings 150 (such as where Gx is one of gain setting G1, gain setting G2, gain setting G3, gain setting G4, etc.).

Subsequent to selection of the gain setting Gx, via application of the selected gain setting Gx to the amplifier 145 and based on the output voltage 171 (amplified sample voltage 137) of the amplifier 145, the controller 140 determines and monitors a magnitude of the current 121 through the winding 131 (such as a motor winding, inductor, etc.).

As further discussed herein, the controller 140 adjusts the magnitude of the selected gain setting Gx applied to the amplifier 145 depending on one or more parameters such as an actual magnitude of the current 121 through the winding 131, anticipated magnitude of the current 121 through the winding 131 based on a selected operational range of controlling current through the motor winding, setting of operating the system 100, etc.

Note further that the resistive path 135 as described herein can be implemented in any suitable. For example, in one embodiment, the resistive path 135 is a resistor (of known resistance) disposed in series with the respective winding 131 being monitored and controlled. Alternatively, as further discussed herein with respect to other FIGS. and descriptive text, the resistive path 135 is an ON resistance between nodes of respective switch 120 through which the current 121 passes to and through the winding 131.

As previously discussed, the winding can be any type of winding. In accordance with further embodiments, the winding 131 is a motor winding. The controller 140 controls a magnitude of the current 121 through the motor winding via control input 105 received (through the user interface 115) from a user 108 operating a tool (system 100) including the motor winding.

As a further example embodiment, via input 105, the controller 140 receives (through the user interface 115) a current limit value indicating a maximum amount of current 121 (which corresponds to a maximum torque 139 value) in which to drive the winding 131. Via a spring-loaded trigger control (such as user interface 115), the user 108 produces speed control input (such as control input 105) to control a speed of a drill bit receiving torque 139 generated by the winding 131 as it turns a respective motor shaft coupled to the drill bit. In such an instance, based on the currently selected maximum torque setting (a.k.a., maximum electric clutch setting, or range of current associated with such a maximum torque setting) or selected maximum allowed current through the winding 131, the controller 140 selects an appropriate gain setting of the amplifier 145.

In a released trigger state associated with trigger corresponding to a full OFF position, the controller 140 controls switch 120 such that current 121 is zero through the winding 131 (corresponding to no torque). As the trigger is squeezed from zero to a maximum squeezed trigger setting, the controller 140 increases a magnitude of the current 121 up to a maximum torque setting (current setting) selected by the user 108.

In a manner as previously discussed, to provide accurate current monitoring and detection during operation of the respective power tool in the current limit mode, the controller 140 chooses an appropriate gain such as gain Gx (such as G1, G2, G3, G4, etc.) from gain settings such that the full range (or a portion of such range) of the amplifier output (producing output voltage 171) is used to monitor a magnitude of the current 121 between zero and the maximum selected torque and current 121 setting.

As a more specific example, in one embodiment, if the selected range of current 121 is 0 to 25 amperes (where maximum torque may be anywhere between 0 and 25 amps), and the corresponding range of the amplifier is 0 volts (corresponding to zero current 121) to a maximum voltage (corresponding to maximum current 121 of 25 Amps), the controller 140 selects the magnitude of the gain Gx to be subscriber domain follows:

$Gx$=output voltage 171/(25 Amps times $R$), where $R$=the resistance of the resistive path 135

Thus, if desired, the gain Gx can be derived based on a maximum range of the current 121. Such dynamic adjustment of the gain provides most accurate measurement of the current 121 because the full range (or greater portion of range) of the output of amplifier 145 is used to determine the magnitude of current 121.

Note again that embodiments herein are useful over conventional techniques. For example, as further discussed herein, embodiments herein include implementing variable gain control techniques to more accurately determine a magnitude of current 121 through a resistive path 135 and corresponding winding 131 over different possible current settings and ranges.

Figure 2:
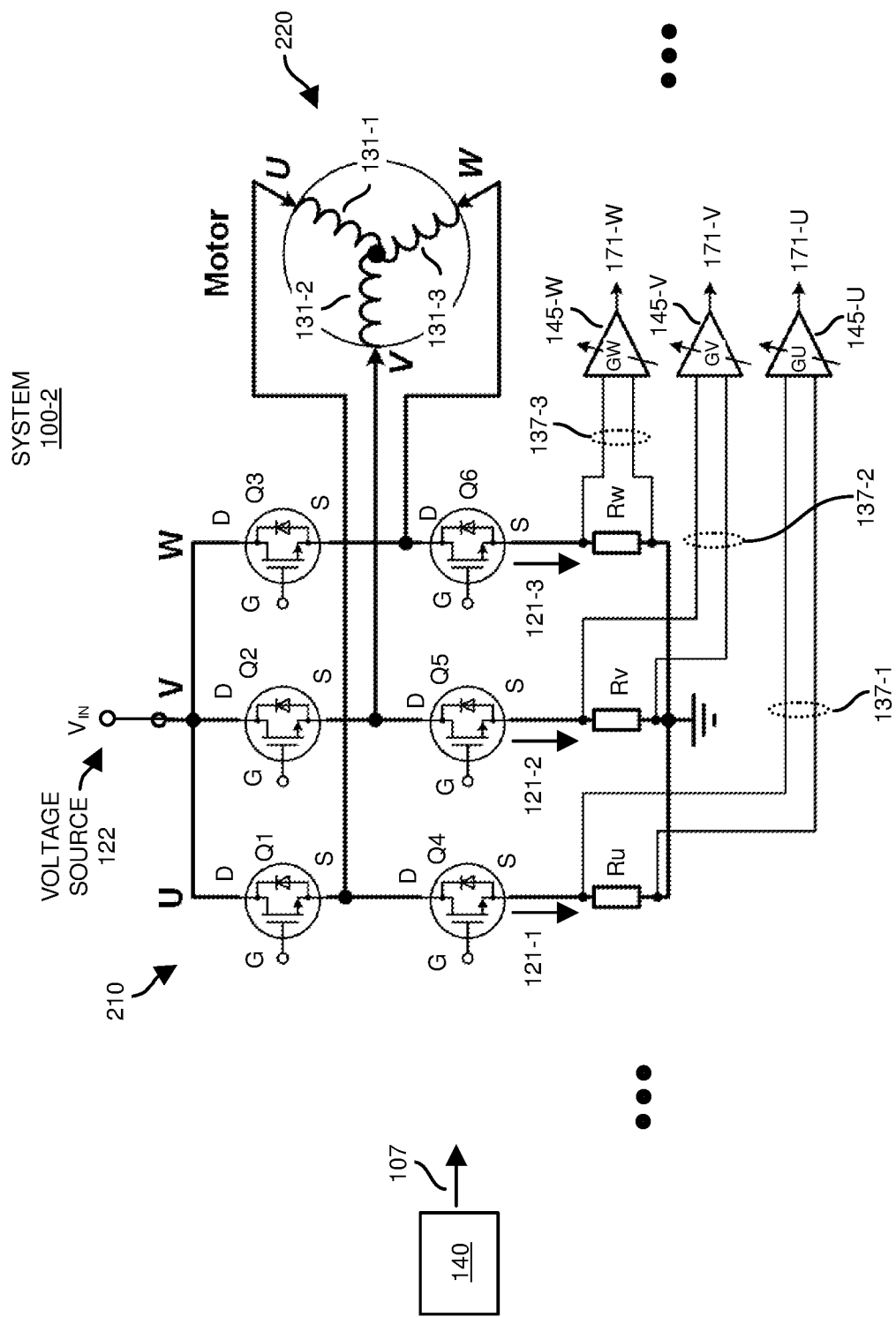
FIG. 2 is an example diagram illustrating current sensing and control associated with each of multiple motor windings according to embodiments herein.
Figure 3:
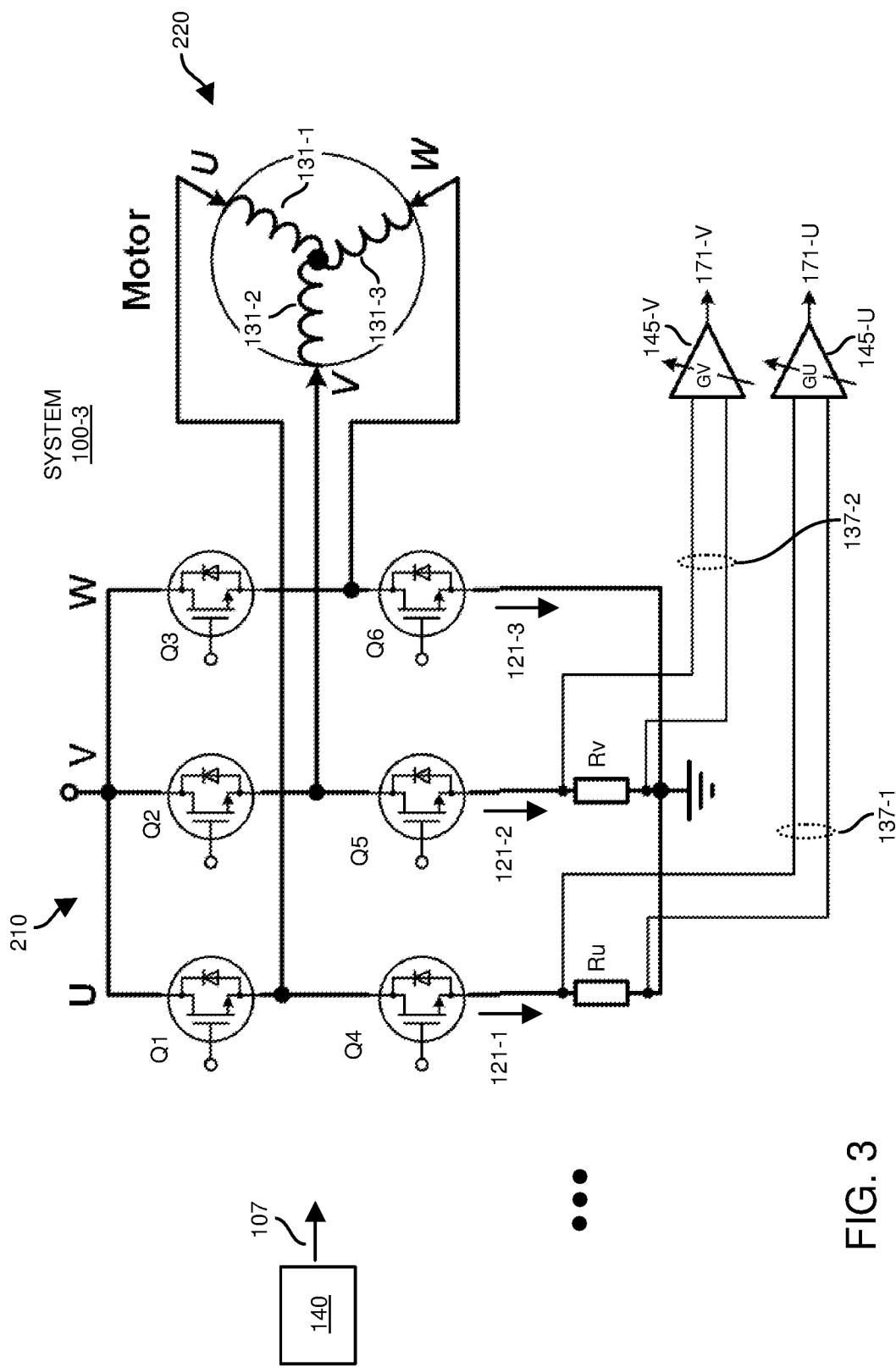
FIG. 3 is an example diagram illustrating current sensing and control amongst multiple motor windings according to embodiments herein.
Figure 4:
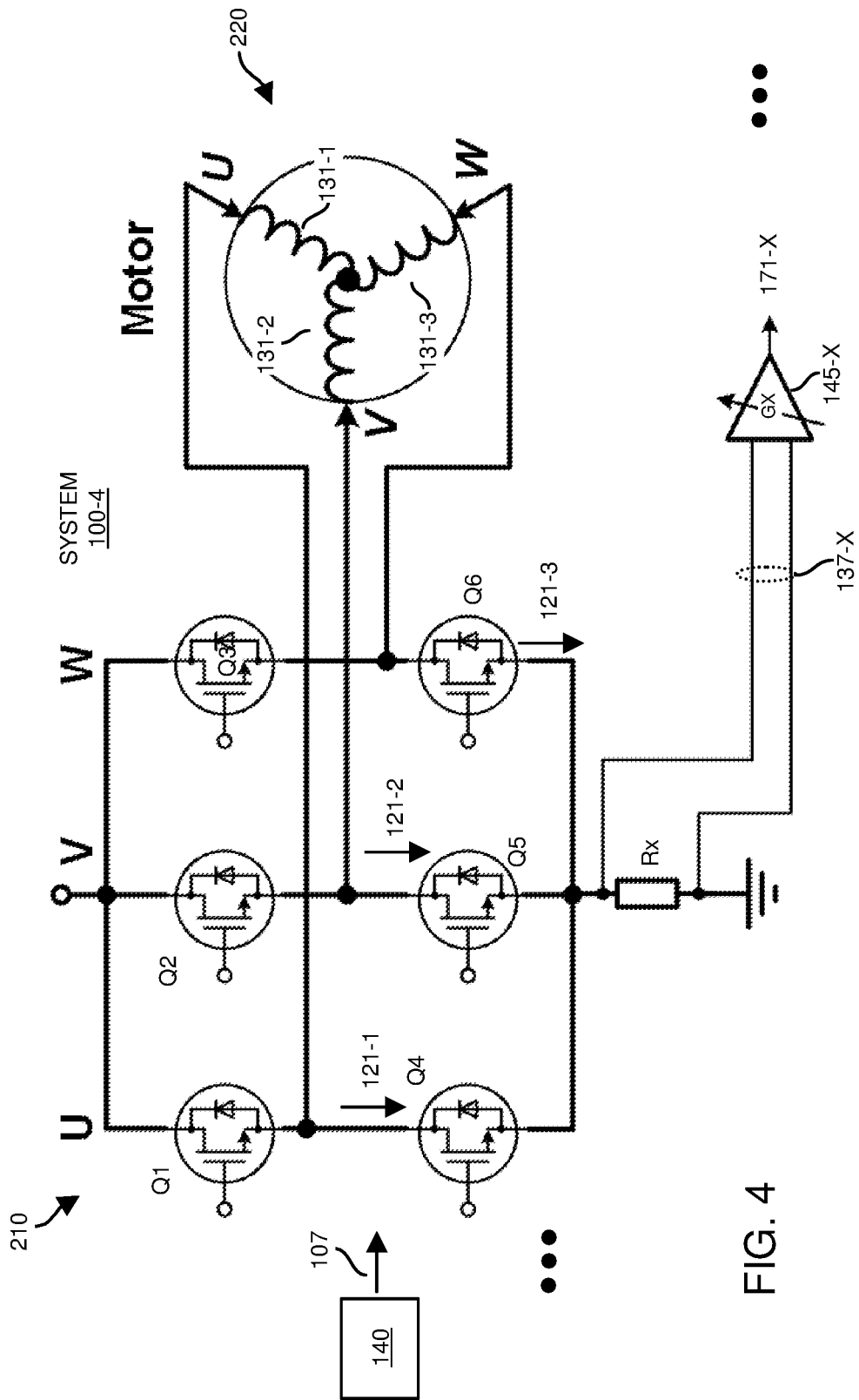
FIG. 4 is an example diagram illustrating current sensing and control of multiple motor windings according to embodiments herein.

The following FIGS. 2-6 and corresponding text illustrate implementations of variable gain amplifiers, which can be integrated with a gate driver or controller IC (Integrated Circuit), to achieve accurate current sensing with shunt resistors in motor control. Note that the shunt resistors (a.k.a., resistive paths) can be disposed in the legs of the inverters as shown in FIGS. 2-4, with options of three-shunt, two-shunt, and one-shunt (aka. single-shunt). For two-shunt implementations, respective shunt resistors can be disposed in any two legs of the respective inverter.

Note that the switch devices associated with the inverter shown in FIGS. 2-4 and FIGS. 5-6 can be any suitable type such as MOSFETs (Metal Oxide Semiconductor Field Effect Transistors), IGBT (Insulated-Gate Bipolar Transistor), BJT (Bipolar Junction Transistors), etc. Note further that embodiments herein not only work for three phase motor control for PMSM (Permanent Magnet Synchronous Motor), BLDC (Brushless DC Motor), or ACIM (AC Induction Motor) motors, but also work for other types of motor control, e.g., H-bridge brushed or brushless motor control, step motor control, etc., where accurate current sensing is desired.

FIG. 2 is an example diagram illustrating current sensing and control associated with each of multiple motor windings according to embodiments herein.

In this example embodiment, the system 100-2 includes inverter 210, motor 220, resistive paths Ru, Rv, and Rw, and amplifiers 145-U, 145-V, and 145-W.

Inverter 210 includes switches Q1, Q2, Q3, Q4, Q5, and Q6.

A combination of switch Q1, switch Q4, and resistive path Ru form a first series path between voltage source Vin (supply voltage such as 5 VDC or other suitable value) and ground; a combination of switch Q2, switch Q5, and resistive path Rv form a second series path between voltage source Vin and ground; a combination of switch Q3, switch Q6, and resistive path Rw form a third series path between voltage source Vin and ground.

Motor 220 includes three windings such as motor winding 131-1, motor winding 131-2, and motor winding 131-3. The sum of current 121-1, 112-2, and 121-3 through all windings 131-1, 131-2, and 131-3 is zero. Hence, if a magnitude of currents through two windings is known, the current in the third winding can be determined from the first two currents.

All three windings 131-1, 131-2, and 131-3 are connected together at a common node of the motor 220.

Each winding is also connected to a respective series circuit path associated with the inverter 210. For example, a second node of winding 131-1 is connected to the source node (S) of switch Q1 and the drain node (D) of the switch Q4; a second node of winding 131-2 is connected to the source node (S) of switch Q2 and the drain node (D) of the switch Q5; a second node of winding 131-3 is connected to the source node (S) of switch Q3 and the drain node (D) of the switch Q6.

In yet further example embodiments, via generation of the control signals 107 applied to respective switches Q1-Q6, the controller 140 controls an amount of current through the windings.

Via output voltages 171-U, 171-V, and 171-W, the controller 140 monitors respective magnitudes of current 121-1, 121-2, and 121-3 through each of the respective multiple windings 131-1, 131-2, and 131-3 of motor 220.

As previously discussed, the controller 140 applies a respective selected gain setting G to each of the multiple amplifiers; the respective selected gain setting being chosen from the multiple gain settings 150.

For example, depending on a range of anticipated or maximum current through each of the windings 131-1, 131-2, and 131-3, the controller 140 selects and applies (based on the maximum current or corresponding range) an appropriate gain Gu to amplifier 145-U; the controller 140 selects and applies gain Gv to amplifier 145-V; the controller 140 selects and applies gain Gw to amplifier 145-W.

In a similar manner as previously discussed, amplification of a respective sample voltage using the selected gain setting, the controller 140 monitors a magnitude of respective current through each of the motor windings in an appropriate window of time.

For example, when switch Q4 is activated to an ON state in a control cycle, the controller 140 determines a magnitude of the current 121-1 through the winding 131-1 based on amplification (based on amplifier 145-1 and gain setting Gu) of the voltage 137-1 across resistive path Ru; when switch Q5 is activated to an ON state in the control cycle, the controller 140 determines a magnitude of the current 121-2 through the winding 131-2 based on amplification (based on amplifier 145-2 and gain setting Gv) of the voltage 137-2 across resistive path Rv; when switch Q6 is activated to an ON state in the control cycle, the controller 140 determines a magnitude of the current 121-3 through the winding 131-3 based on amplification (based on amplifier 145-3 and gain setting Gw) of the voltage 137-3 across resistive path Rw.

FIG. 3 is an example diagram illustrating current sensing and control amongst multiple motor windings according to embodiments herein.

In this example embodiment, in a similar manner as previously discussed, the system 100-3 includes inverter 210, motor 220, resistive paths Ru and Rv, and amplifiers 145-U and 145-V.

Via generation of the control signals 107 applied to respective switches Q1-Q6, the controller 140 controls an amount of current through the windings. Via output voltages 171-U and 171-V, the controller 140 monitors respective magnitudes of current 121-1, 121-2, and 121-3 through each of the respective multiple windings 131-1, 131-2, and 131-3 of motor 210.

As previously discussed, the controller 140 applies a respective selected gain setting G to each of the multiple amplifiers; the respective selected gain setting being chosen from the multiple gain settings 150 as previously discussed.

In one embodiment, depending on a range of anticipated or maximum current through each of the windings 131-1, 131-2, and 131-3, the controller 140 selects and applies gain Gu to amplifier 145-U; the controller 140 selects and applies gain Gv to amplifier 145-V.

Further, in a similar manner as previously discussed, amplification of a respective sample voltage using the selected gain setting, the controller 140 monitors a magnitude of respective current through each of the motor windings.

For example, when switch Q4 is activated to an ON state in a control cycle, the controller 140 determines a magnitude of the current 121-1 through the winding 131-1 based on amplification (based on amplifier 145-1 and gain setting Gu) of the voltage 137-1 across resistive path Ru; when switch Q5 is activated to an ON state in the control cycle, the controller 140 determines a magnitude of the current 121-2 through the winding 131-2 based on amplification (based on amplifier 145-2 and gain setting Gv) of the voltage 137-2 across resistive path Rv.

As previously discussed, the sum of current through all windings 131-1, 131-2, and 131-3 is zero. Hence, if current through each of the two windings 131-1 and 131-2 is known via measurements of output voltage 171-U and 171-V, the current 121-3 in the third winding can be determined from these first two currents.

FIG. 4 is an example diagram illustrating current sensing and control of multiple motor windings according to embodiments herein.

In this example embodiment, in a similar manner as previously discussed, the system 100-4 includes inverter 210, motor 220, resistive path Rx, and amplifier 145-X.

Via generation of the control signals 107 applied to respective switches Q1-Q6, the controller 140 controls an amount of current through the windings 131-1, 131-2, and 131-3. The controller 140 measures an output voltage 171-X of the amplifier 145-X during appropriate windows of time when the respective low side switch circuitry is activated to determine currents 121-1, 121-2, and 121-3 through respective windings 131-1, 131-2, and 131-3.

More specifically, during a first window of time when the switch Q4 is activated ON and Q1 is deactivated to an OFF state via control signals 107, the controller 140 measures the output voltage 171-X to determine a magnitude of the current 121-1 through the winding 131-1; during a second window of time when the switch Q5 is activated ON and Q2 is deactivated to an OFF state via control signals 107, the controller 140 measures the output voltage 171-2 to determine a magnitude of the current 121-2 through the winding 131-2; during a third window of time when the switch Q6 is activated ON and Q3 is deactivated to an OFF state via control signals 107, the controller 140 measures the output voltage 171-X to determine a magnitude of the current 121-3 through the winding 131-3.

Thus, the output voltage 171-X, the controller 140 monitors respective magnitudes of current 121-1, 121-2, and 121-3 through each of the respective multiple windings 131-1, 131-2, and 131-3 of motor 210.

In a similar manner as previously discussed, the controller 140 applies a respective selected gain setting Gx to the amplifier 145-X; the respective selected gain setting is chosen from the multiple gain settings 150. For example, depending on a range of anticipated or maximum current through each of the windings 131-1, 131-2, and 131-3, the controller 140 selects and applies gain Gx to amplifier 145-X.

Further, in a similar manner as previously discussed, amplification of a respective sample voltage using the selected gain setting, the controller 140 monitors a magnitude of respective current through each of the motor windings. For example, when switch Q4 is activated to an ON state in a control cycle, the controller 140 determines a magnitude of the current 121-1 through the winding 131-1 based on amplification (based on amplifier 145-X and gain setting Gx) of the voltage 137-X across resistive path Rx; when switch Q5 is activated to an ON state in a control cycle, the controller 140 determines a magnitude of the current 121-2 through the winding 131-2 based on amplification (based on amplifier 145-X and gain setting Gx) of the voltage 137-X across resistive path Rx; when switch Q6 is activated to an ON state in a control cycle, the controller 140 determines a magnitude of the current 121-3 through the winding 131-3 based on amplification (based on amplifier 145-X and gain setting Gx) of the voltage 137-X across resistive path Rx.

Thus, a single common shunt resistor such as resistive path Rx can be used to identify currents through each of the windings 131-1, 131-2, and 131-3.

Figure 5:
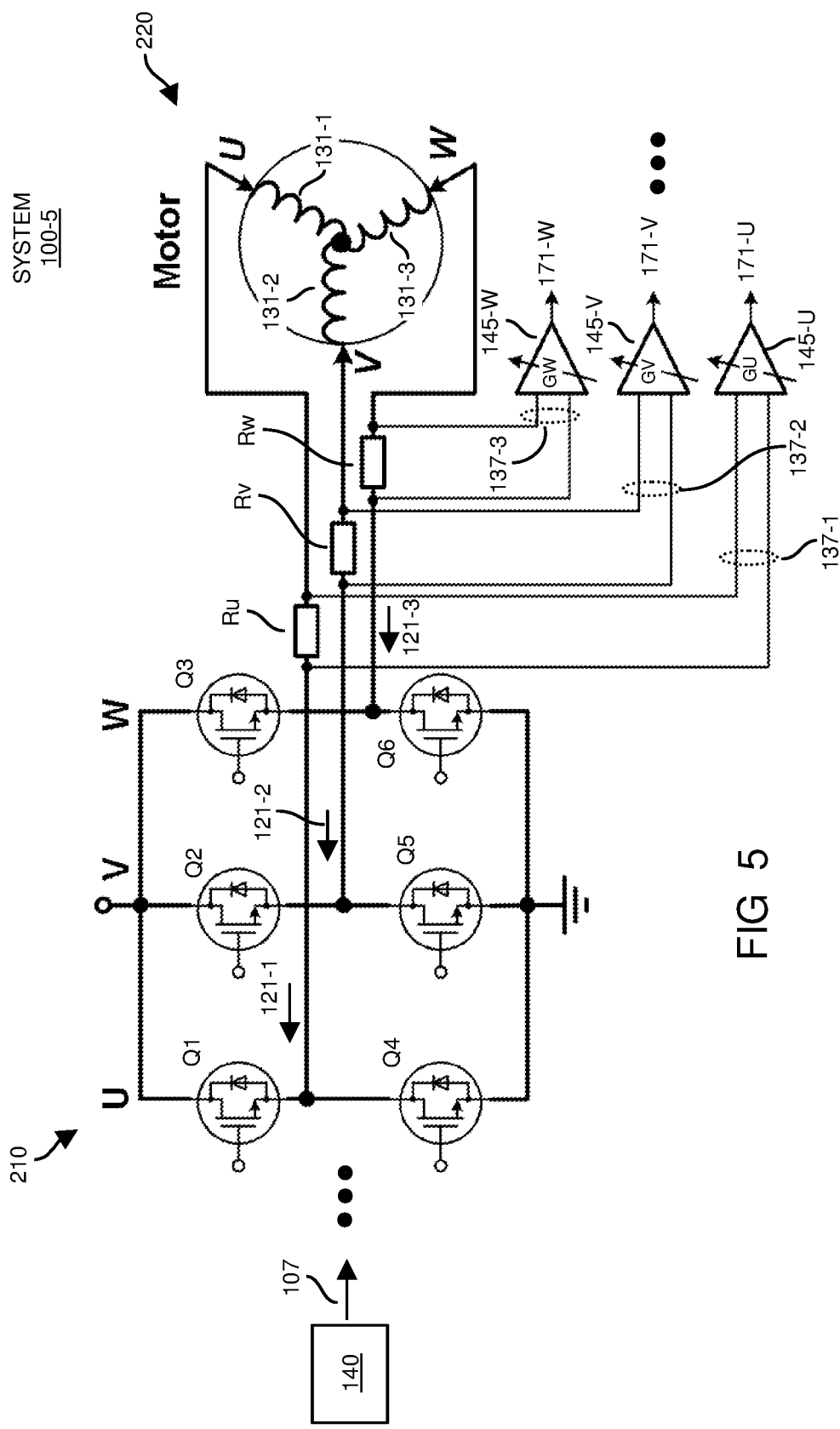
FIG. 5 is an example diagram illustrating current sensing and control of multiple motor windings according to embodiments herein.
Figure 6:
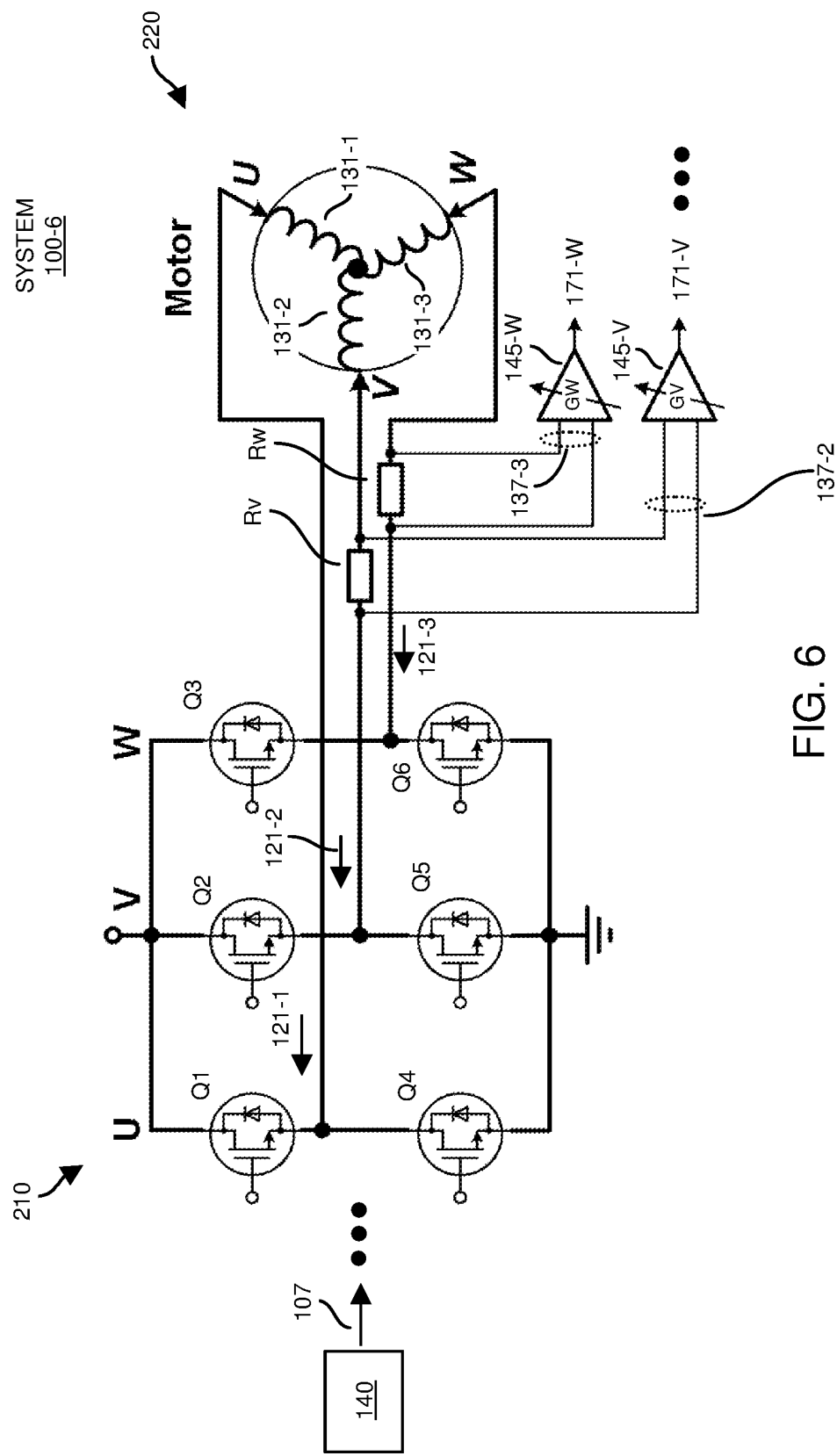
FIG. 6 is an example diagram illustrating current sensing and control of multiple motor windings according to embodiments herein.

Note further that the shunt resistors can also be in-line with motor phases as shown in FIGS. 5-6, with options of three-shunt and two-shunt. For a two-shunt embodiment, the shunt resistors (resistive paths) can be in any two phases of the motor.

FIG. 5 is an example diagram illustrating current sensing and control of multiple motor windings according to embodiments herein.

System 100-5 is a variation of the system 101-2 in FIG. 2 in which the resistive paths Ru, Rv, and Rw are disposed in series between respective windings 131-1, 131-2, and 131-3 and series switch pairs Q1/Q4, Q2/Q5, and Q3/Q6.

FIG. 6 is an example diagram illustrating current sensing and control of multiple motor windings according to embodiments herein.

System 100-6 is a variation of the system 101-3 in FIG. 3 in which the resistive paths Rv, and Rw are disposed in series between respective windings 131-2 and 131-3 and series switch pairs Q2/Q5 and Q3/Q6.

Adjustment of Amplifier Gains

One way to adjust the gain of the amplifiers is to change the gain depending on different motor settings, e.g., so-called power tool E-clutch settings. Below embodiments include an example and corresponding explanation.

For example, the amplifier gains associated with amplifier 145 can be: 4, 8, 12, 16, 20, 24, 32, 48, and 64. In one embodiment, the amplifier gains are selected by the controller 140 such as through SPI communications.

1. Power tool drill mode: maximum motor phase current to sense is ±150 Amps;
2. E-clutch mode #1: maximum motor phase current to sense is 13 A to 39 A, accuracy 4%;
3. E-clutch mode #2: maximum motor phase current to sense is 5 A to 12 A, accuracy 4%.
4. The current sensing shunt resistor value is 0.5 mΩ;
5. ADC resolution: 12-bit;
6. ADC reference voltage: 5 V.
7. Amplifier output are biased to 2.5 V for bi-directional current sensing.

Table 1 shows the possible combination of the amplifier gains, and the accuracy of each ADC LSB (Least Significant Bit) to meet the requirements. If a fixed gain solution is used, the gain of 16 (or less) is used for all the settings: i.e.: E-clutch disabled (power tool drill mode), E-clutch mode #1, and E-clutch mode #2 for this example, then the current per ADC LSB will be too high to meet the requirements.

TABLE 1

Amplifier gain setting according to motor settings

| | Shunt resistor (mΩ) | Amplifier gain Gx setting | Max measurable current (A) | ADC resolution (bits) | Current per ADC LSB (A/LSB) | Current per 6x ADC LSB (A/LSB) |
|---|---|---|---|---|---|---|
| 0 A to ± 150 A max, e-clutch disabled | 0.5 | 16 | 162 | 12 | 0.075 | 0.458 |
| 13 A to 39 A with e-clutch 14 settings | | 32 | 78 | | 0.038 | 0.229 |
| 5 A to 13 A with e-clutch 14 settings | | 64 | 39 | | 0.019 | 0.114 |

Thus, when the controller 140 detects that the e-clutch is disabled, the controller applies a gain of 16 to each of the one or more amplifiers 145; when the controller 140 detects that the e-clutch is set to one of 14 settings between 13 Amps and 39 Amps, the controller 140 applies a gain of 32 to each of the one or more amplifiers 145; when the controller 140 detects that the e-clutch is set to one of 14 settings between 5 Amps and 13 Amps, the controller 140 applies a gain of 64 to each of the one or more amplifiers 145. As previously discussed, the controller can be configured to limit current 121 through a respective winding based on one of the selected 14 settings for the range. The adjusted gain value for a respective range ensures an accurate reading of the respective current 121.

Figure 7:
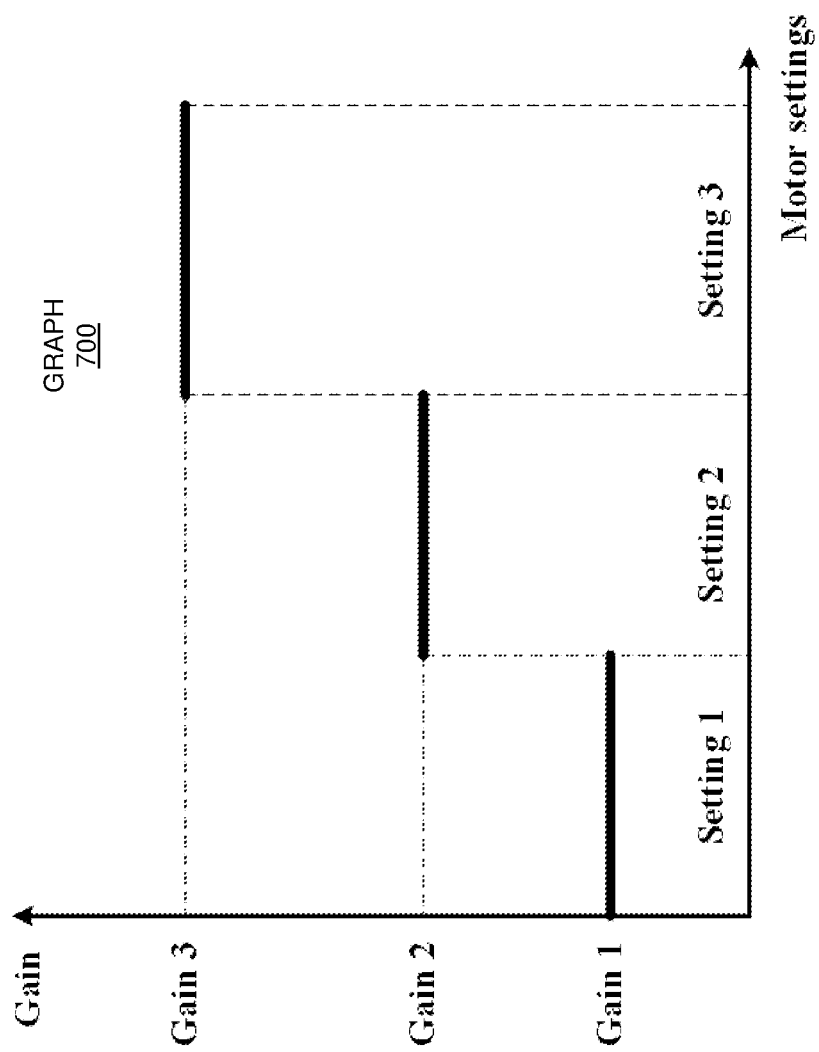
FIG. 7 is an example diagram illustrating different gain settings applied to current monitoring amplifiers according to embodiments herein.

FIG. 7 is an example diagram illustrating different gain settings applied to a current monitoring amplifiers according to embodiments herein.

Further embodiments herein include, via the controller 140, controlling operation of a respective switch disposed in series with each respective motor winding. The controller 140 adjusts the gain of the amplifier 145 depending on a selected mode/operational range in which the current through the motor winding is selectable via a respective user.

More specifically, as indicated by graph 700, for settings #1 such as a selected by the user 108 via user interface 115, the controller 140 applies gain #1 to the one or more amplifiers 145 used to monitor a magnitude of respective current; for settings #2 such as a selected by the user 108 via user interface 115, the controller 140 applies gain #2 to the one or more amplifiers used to monitor a magnitude of respective current; for settings #3 such as a selected by the user 108 via user interface 115, the controller 140 applies gain #3 to the one or more amplifiers used to monitor a magnitude of respective current.

Figure 8:
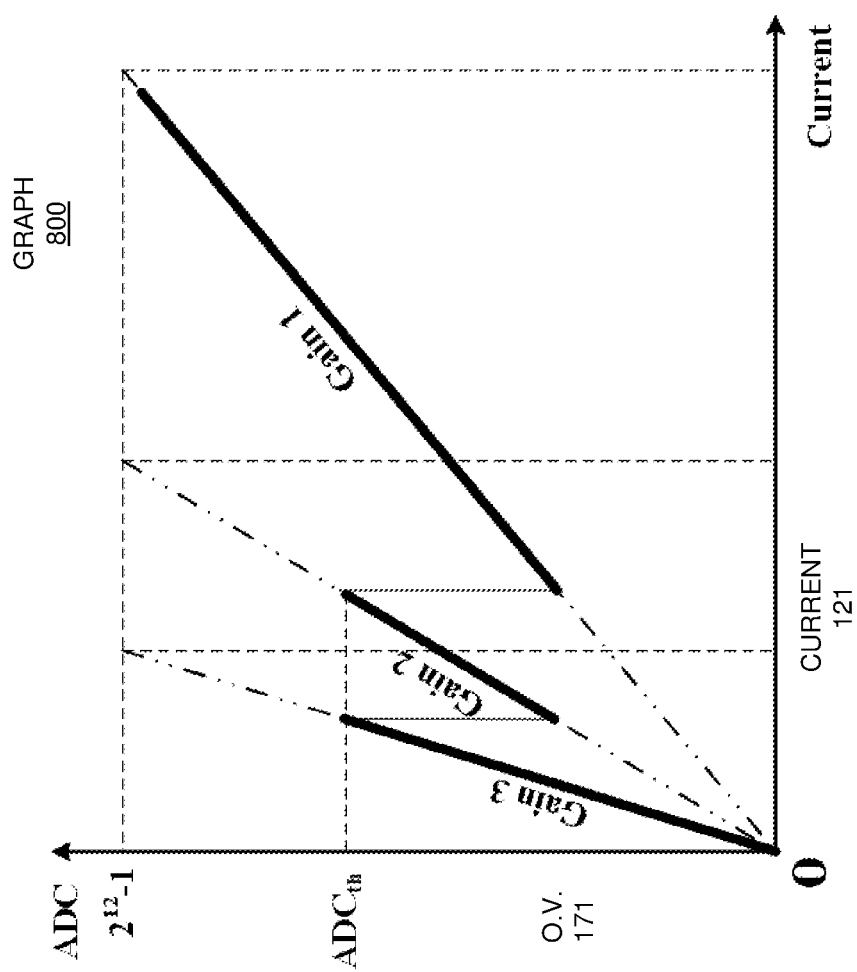
FIG. 8 is an example diagram illustrating implementation of different gain settings of an amplifier for different magnitudes of monitored current according to embodiments herein.

FIG. 8 is an example diagram illustrating implementation of different gain settings of an amplifier for different magnitudes of monitored current according to embodiments herein.

Another way to adjust the gain of the amplifiers 145 (such as via controller 140 or other suitable resource) is to change the selected gain depending on current or received ADC (analog-to-digital converter) sample voltage 137 values, where the current can be shunt current, instant motor phase current, motor phase current magnitude, battery current (e.g.: in one shunt current sensing), and etc.

In this example embodiment, FIG. 8 illustrates the ADC value versus the actual current through a winding. The controller 140 applies a different amplifier gain adjustment value on-the-fly when the ADC values reach a configurable threshold value ADCth.

This example in graph 800 shows three amplifier gains (Gain1, gain 2, and gain3), but note that greater or fewer gain settings are possible.

As shown in graph 800, note that still further embodiments herein include, via the controller 140, decreasing a magnitude of the selected gain (such as from gain 3 to gain 2, or from gain 2 to gain 1) of the amplifier in response to detecting an increase in the magnitude of the current through the motor winding as indicated by sample voltage 137; and increasing the magnitude of the selected gain of the amplifier (such as from gain 1 to gain 2, or from gain 2 to gain 3) in response to detecting a decrease in the magnitude of the current through the motor winding as indicated by the sample voltage 137. In this example embodiment gain3>gain2, gain2>gain1.

Figure 9:
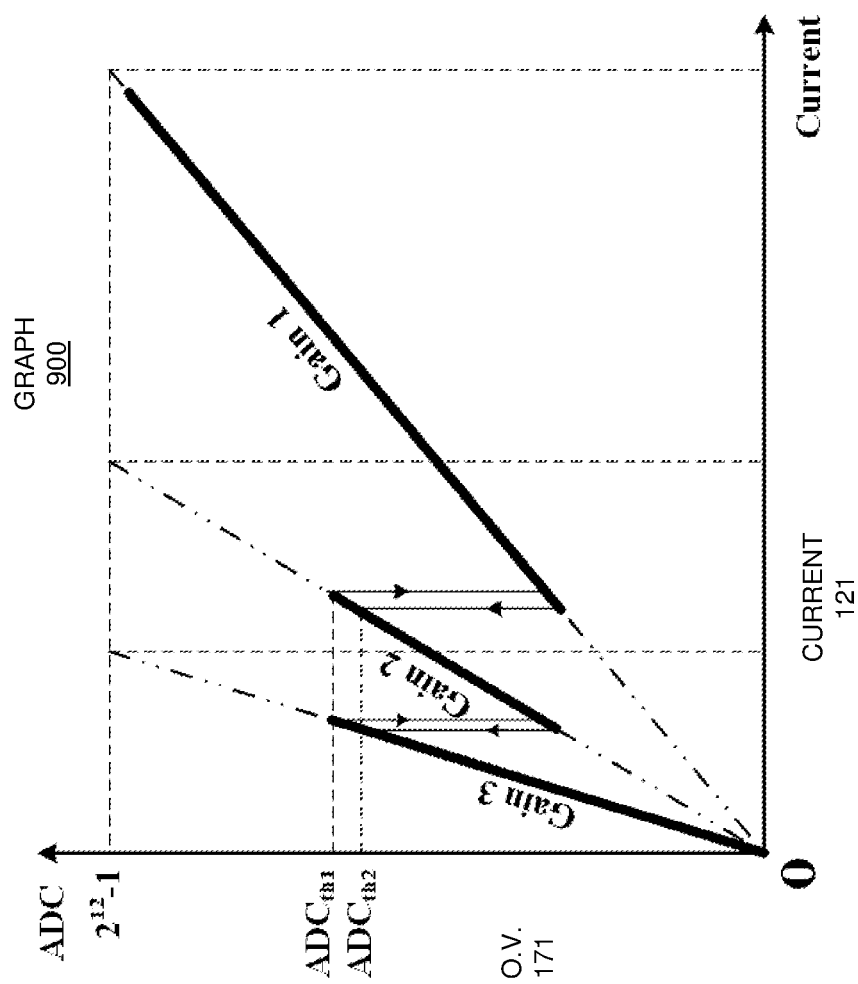
FIG. 9 is an example diagram illustrating different gain settings and corresponding hysteresis applied to an amplifier for different magnitudes of monitored current according to embodiments herein.

FIG. 9 is an example diagram illustrating different gain settings and corresponding hysteresis applied to an amplifier for different magnitudes of monitored current according to embodiments herein.

Graph 900 is a replica of graph 800 in FIG. 8 except that controller 140 implements hysteresis associated with the graph 900. In other words, to prevent too frequent amplifier gain adjustments near the borders of different amplifier gains (such as from gain 3 to gain 2, or from gain 2 to gain 1 or vise versa), embodiments herein include implementing hysteresis to the gain adjustment values as shown in FIG. 9 where the hysteresis bandwidth is configurable.

Thus, embodiments herein include, via the controller 140, implementing hysteresis between a first gain applied to the amplifier 145 and a second gain applied to the amplifier 145 during operations of measuring different magnitudes of the current through windings.

Figure 10:
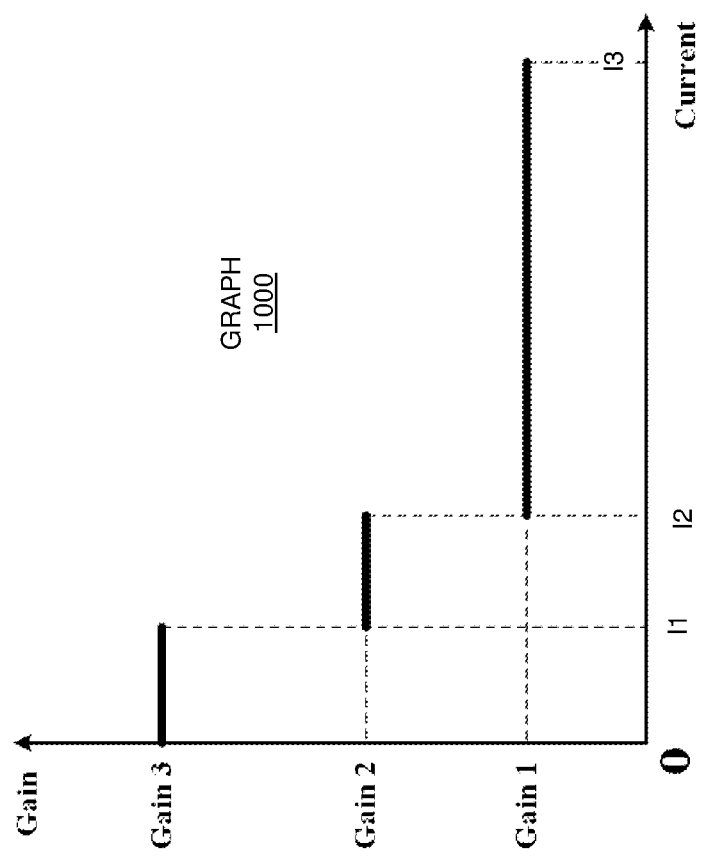
FIG. 10 is an example diagram illustrating different applied amplifier gain settings for different operational current ranges according to embodiments herein.

FIG. 10 is an example diagram illustrating different applied amplifier gain settings for different current ranges according to embodiments herein.

In this example embodiment, when the range of possible user selectable current through the winding 131 is between 0 and value I1 as in graph 1000, the controller 140 applies gain #3 to the amplifier (higher gain); when the range of possible user selectable current through the winding 131 is between value I1 and value I2, the controller 140 applies gain #2 to the amplifier (medium gain); when the range of possible user selectable current through the winding 131 is between value I2 and value I3 (widest range), the controller 140 applies gain #1 to the amplifier (lowest gain). These different applied gain value to the amplifier accommodates the different ranges to provide a more accurate determination of current through the winding for the respective range.

Thus, in accordance with further example embodiments, the controller 140 increases a gain applied to amplifier 145 in response to detecting a decreased operational range such as from range I1 to I2 to range 0 to I1 of selectively controlling the current through the motor winding; the controller 140 decreases a gain (from gain 3 to gain 2) applied to the amplifier 145 in response to detecting an increased operational range such from range as 0 to I1 to range I1 to I2 of selectively controlling the current through the motor winding.

Figure 11:
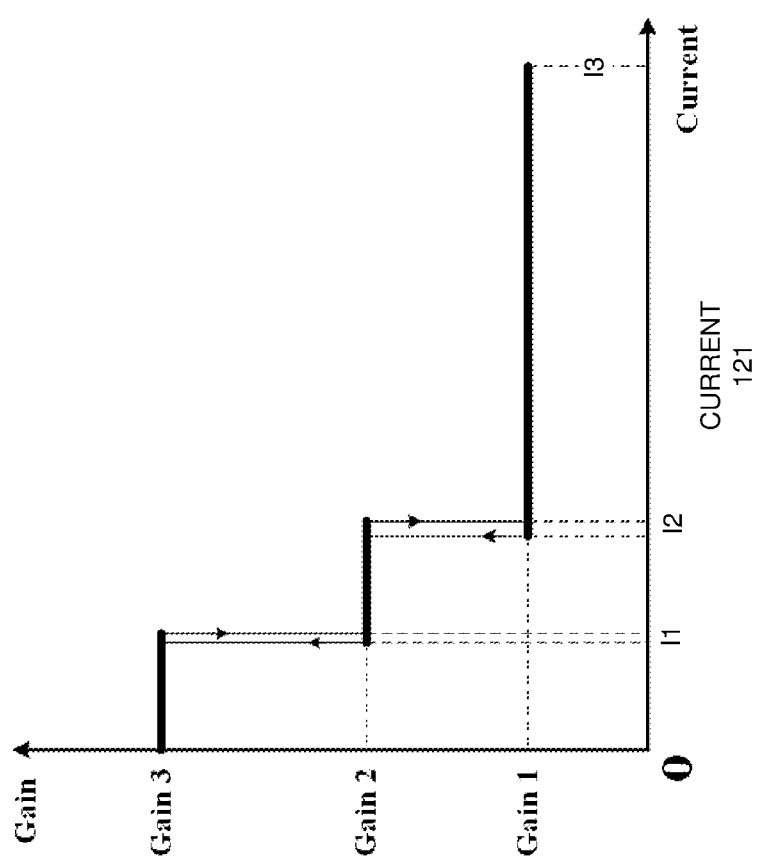
FIG. 11 is an example diagram illustrating implementation of different gain settings and hysteresis to a current monitoring amplifier according to embodiments herein.

FIG. 11 is an example diagram illustrating implementation of different gain settings and hysteresis to a current monitoring amplifier according to embodiments herein.

As shown in FIG. 11, as an extension to the operation with respect to FIG. 10, the controller 140 applies hysteresis when transitioning gain values as the implemented range increases or decreases.

Figure 12:
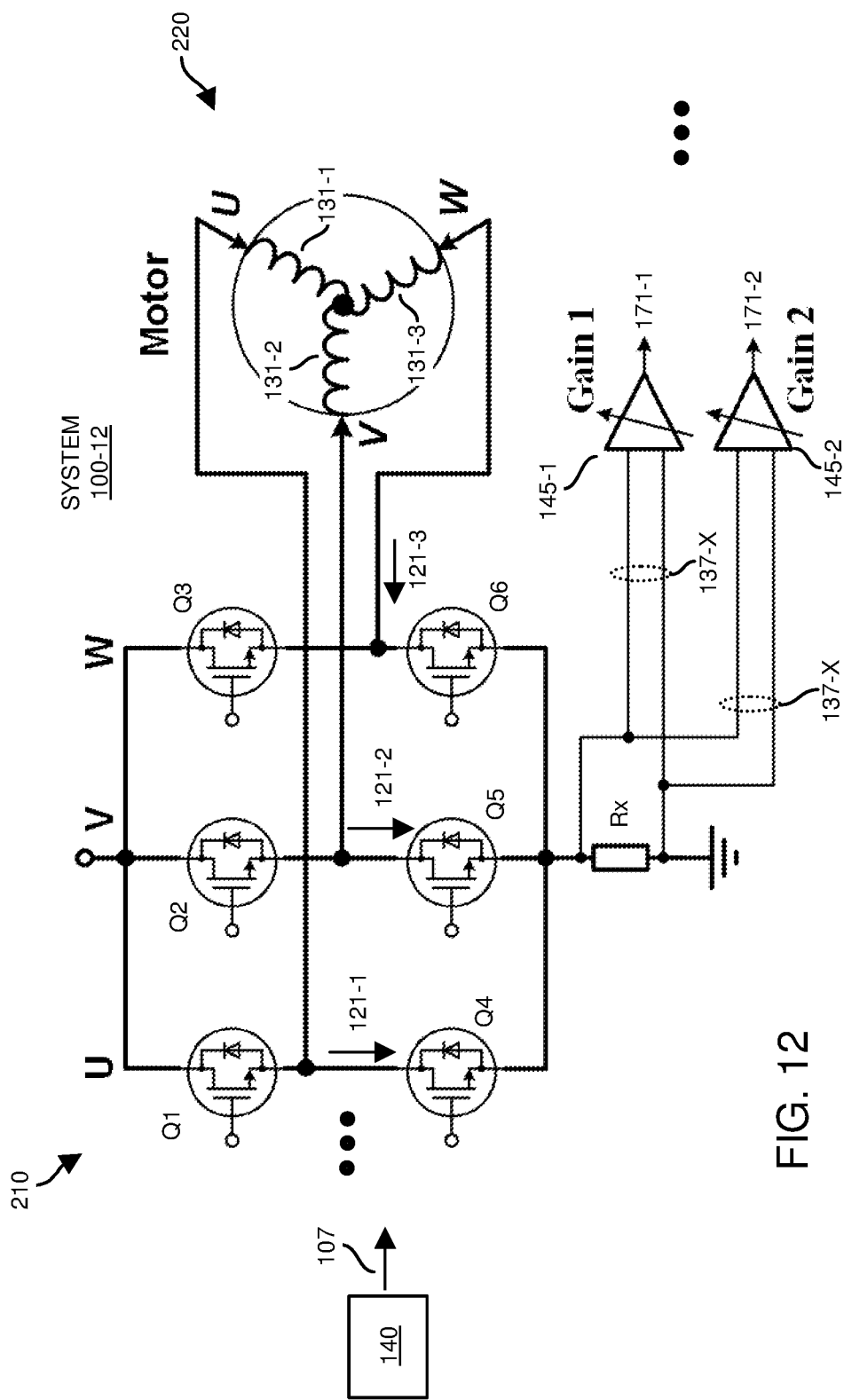
FIG. 12 is an example diagram illustrating implementation of multiple gain-adjusted amplifiers to monitor current through a resistive path according to embodiments herein.

FIG. 12 is an example diagram illustrating implementation of multiple gain-adjusted amplifiers to monitor current through a resistive path according to embodiments herein.

In still further example embodiments, the system 100-12 as described herein includes multiple amplifiers (such as a first amplifier 171-1 and a second amplifier 171-2) coupled to receive the sample voltage 137-X from the resistive path Rx.

The controller 140 applies a first gain (GAIN1) to the first amplifier 145-1 and a second gain (GAIN2) to a second amplifier 145-2. The controller 140 selects between an output of the first amplifier 145-1 (such as output voltage 171-1) and an output of the second amplifier 145-2 (such as output voltage 171-2) to determine the magnitude of the current 121-1, 121-2, 121-3 through each of the windings 131-1, 131-2, and 131-3.

Thus, FIG. 12 shows multiple amplifiers amplifying the same shunt voltage drop with different variable gains. In one embodiment, the controller 140 adjusts one or two of the amplifier gains at a time, and decides to conduct ADC (conversion of the output voltage to a digital value) of selected amplifier output(s) only, or all the ADCs, so that at one moment it can always choose the proper amplifier ADC values for the motor control, and discard those inappropriate ADC values, or abnormal ones due to unexpected amplifier saturation.

If desired, the controller 140 dynamically adjusts the magnitude of each of the amplifiers 145-1 and 145-2 such that at least one of the amplifiers can be used to determine a magnitude of the respective currents through windings.

Figure 13:
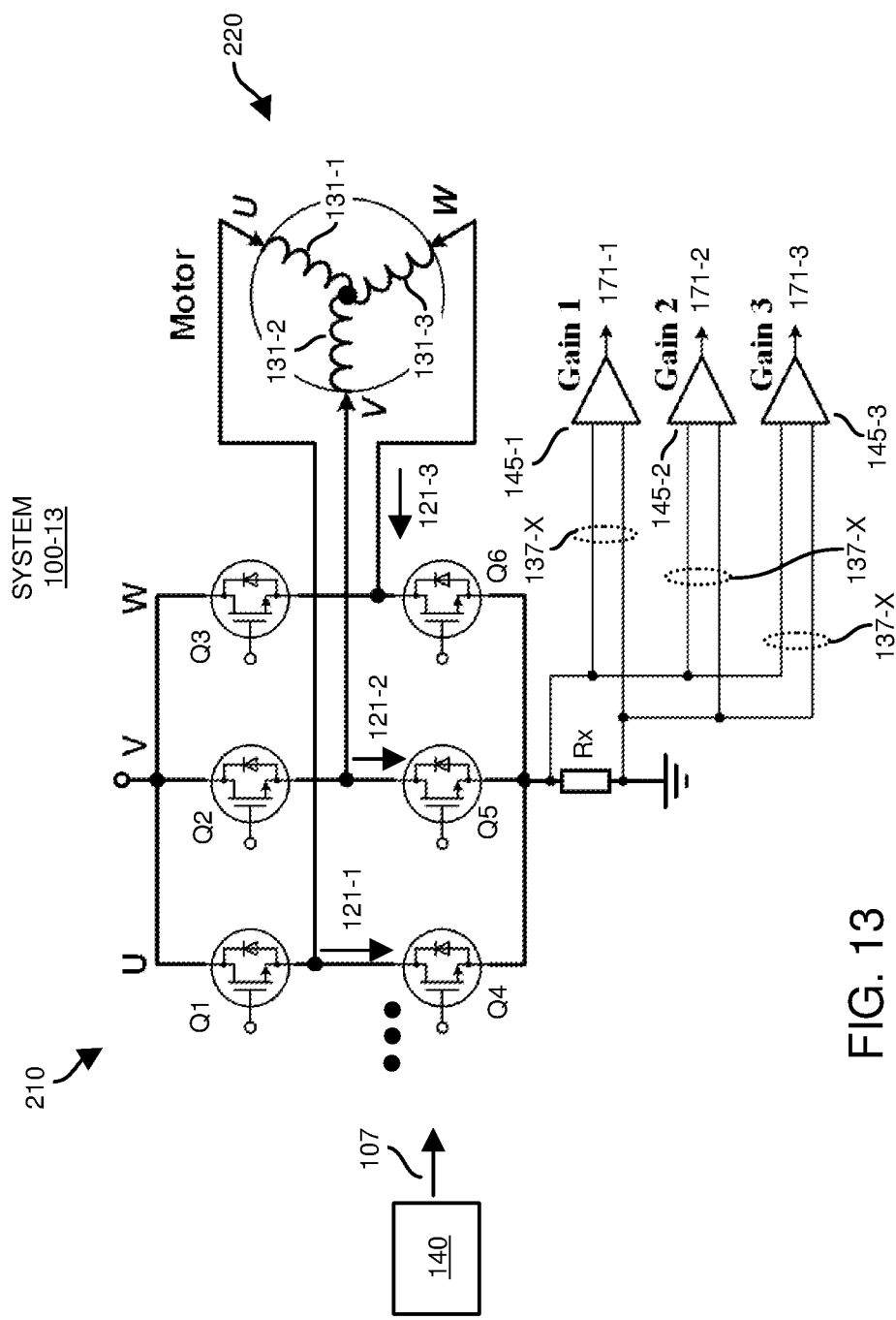
FIG. 13 is an example diagram illustrating application of different gain settings to multiple amplifiers to monitor current through a common resistive path according to embodiments herein.

For both examples system 100-12 and 100-13 in respective FIGS. 12 and 13, accurate current sensing can be achieved for a wide current range. These implementations are especially cost-effective if extra amplifiers are available in the same IC package but would not be used otherwise. Even in the case of using extra operation amplifiers, the cost could eventually be lower than a higher-resolution ADC or higher-end operational amplifier.

FIG. 13 is an example diagram illustrating application of different gain settings to multiple amplifiers to monitor current through a common resistive path according to embodiments herein.

This example embodiment of system 100-13 is similar to system 100-4 in FIG. 4. However, the system 100-13 in FIG. 13 implements multiple parallel amplifiers 145-1, 145-2, and 145-3.

More specifically, amplifier 145-1 is set to a first gain (GAIN1) and monitors sample voltage 137-x across the resistive path Rx; amplifier 145-2 is set to a second gain (GAIN2) and monitors sample voltage 137-x across the resistive path Rx; amplifier 145-3 is set to a third gain (GAIN3) and monitors sample voltage 137-x across the resistive path Rx. In one embodiment, GAIN1>GAIN2>GAIN3.

Depending on a magnitude of the current 121, the controller 140 uses respective one or more output voltages 171-1, 171-2, and/or 171-3 to determine a respective current through the monitored winding.

Thus, as shown in FIG. 13, multiple amplifiers amplify the same shunt voltage drop with different fixed amplifier gains (GAIN1, GAIN2, GAIN3), and similarly at one moment the controller 140 chooses the most appropriate ADC values from one of the amplifier outputs for motor control.

Figure 14:
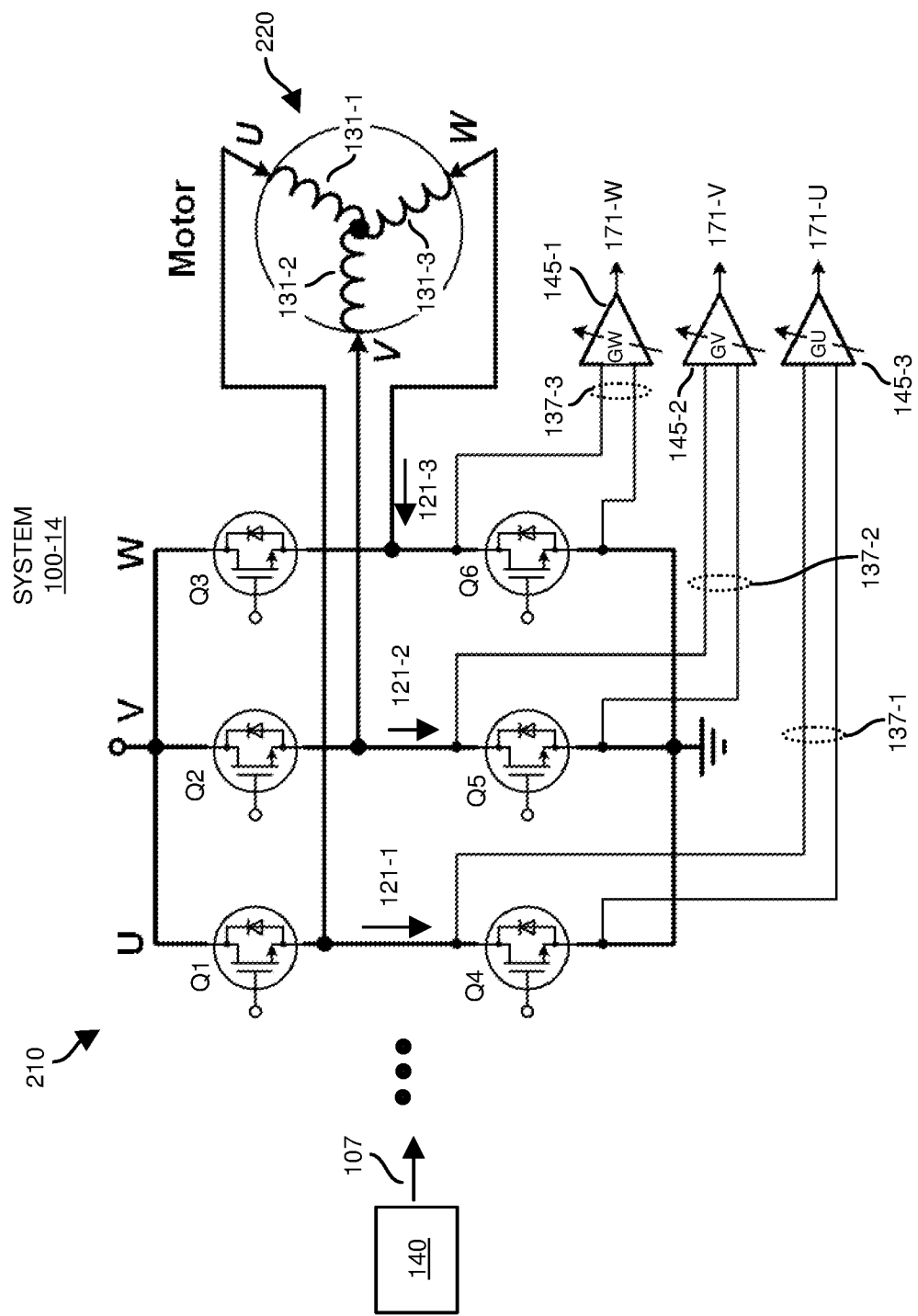
FIG. 14 is an example diagram illustrating use of resistive paths and respective switches to monitor current through multiple windings according to embodiments herein.

FIG. 14 is an example diagram illustrating use of resistive path and respective switches to monitor current through multiple windings according to embodiments herein.

As shown, the variable gain amplifiers 145 can also be used for current sensing using MOSFET RDS(on) (drain-source on-state resistance). MOSFET RDS(on) deviates from part to part and varies with temperature changes, compensations are needed to make the RDS(on) current sensing with variable gain amplifiers to work for more motor control applications.

Thus, in this example embodiment, the system 100-14 includes inverter 210, motor 220, and amplifiers 145.

Inverter 210 includes switches Q1, Q2, Q3, Q4, Q5, and Q6.

As previously discussed, the controller 140 applies a respective selected gain setting G to each of the multiple amplifiers 145-1, 145-2, and 145-3; the respective selected gain setting is chosen by the controller 140 from the multiple gain settings 150. For example, depending on a range of anticipated or maximum current through each of the windings 131-1, 131-2, and 131-3, the controller 140 selects and applies gain Gu to amplifier 145-1; the controller 140 selects and applies gain Gv to amplifier 145-2; the controller 140 selects and applies gain Gw to amplifier 145-3.

In a similar manner as previously discussed, amplification of a respective sample voltage using the selected gain setting, the controller 140 monitors a magnitude of respective current through each of the motor windings in an appropriate window of time. For example, when switch Q4 is activated to an ON state in a control cycle, the controller 140 determines a magnitude of the current 121-1 through the winding 131-1 based on amplification (based on amplifier 145-1 and gain setting Gu) of the voltage 137-1 across drain node D and source node S of the switch Q4 (akin to resistive path Ru); when switch Q5 is activated to an ON state in the control cycle, the controller 140 determines a magnitude of the current 121-2 through the winding 131-2 based on amplification (based on amplifier 145-2 and gain setting Gv) of the voltage 137-2 across drain node D and source node S of the switch Q5 (akin to resistive path Rw); when switch Q6 is activated to an ON state in the control cycle, the controller 140 determines a magnitude of the current 121-3 through the winding 131-3 based on amplification (based on amplifier 145-3 and gain setting Gw) of the voltage 137-1 across drain node D and source node S of the switch Q4 (akin to resistive path 137-3).

Figure 15:
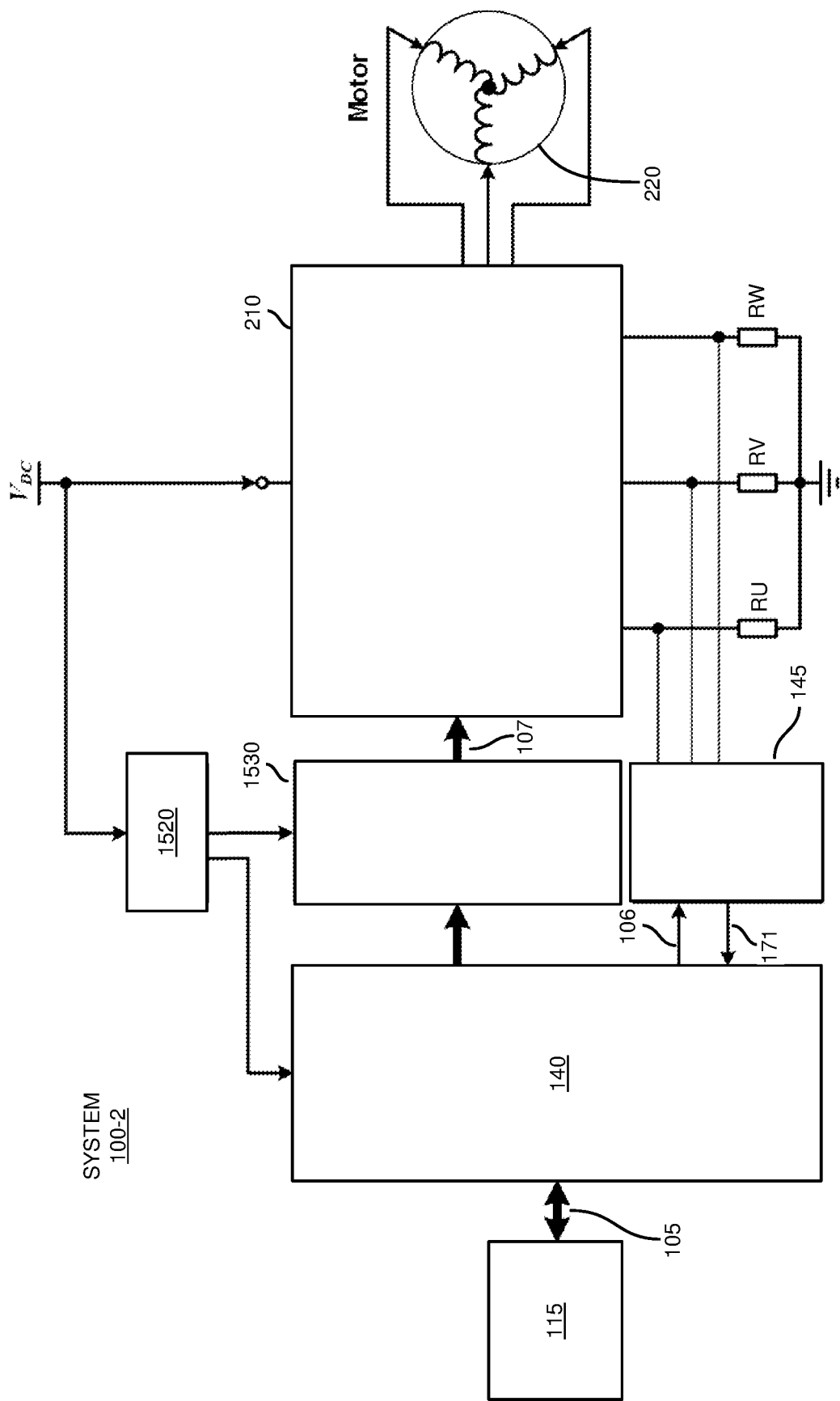
FIG. 15 is an example diagram illustrating a system of controlling and monitoring current through multiple windings in a motor system according to embodiments herein.

FIG. 15 is an example diagram illustrating a system of controlling and monitoring current through multiple windings in a motor system according to embodiments herein.

Note that embodiments herein can be implemented in any suitable environment. For example, embodiments herein can be implemented in motor control algorithms of sensorless FOC (Field-Oriented Control), sensored FOC, BLDC block commutation control with Hall sensors, sensorless BLDC, sensorless or sensored DTC (Direct Torque Control), etc.

System 100-2 (and further illustrating gate drivers 1530, one or more converter 1520, etc.) in FIG. 15 can support sensorless FOC motor control, using three shunt resistors as an example. To sense the motor phase current, the system includes three variable gain amplifiers 145 that amplify the shunt resistor voltages, which are supplied to the input (such as ADC unit) of the controller 140 (such as a microcontroller). As previously discussed, the amplifier gain can be adjusted on-the fly by the controller 140.

Figure 16:
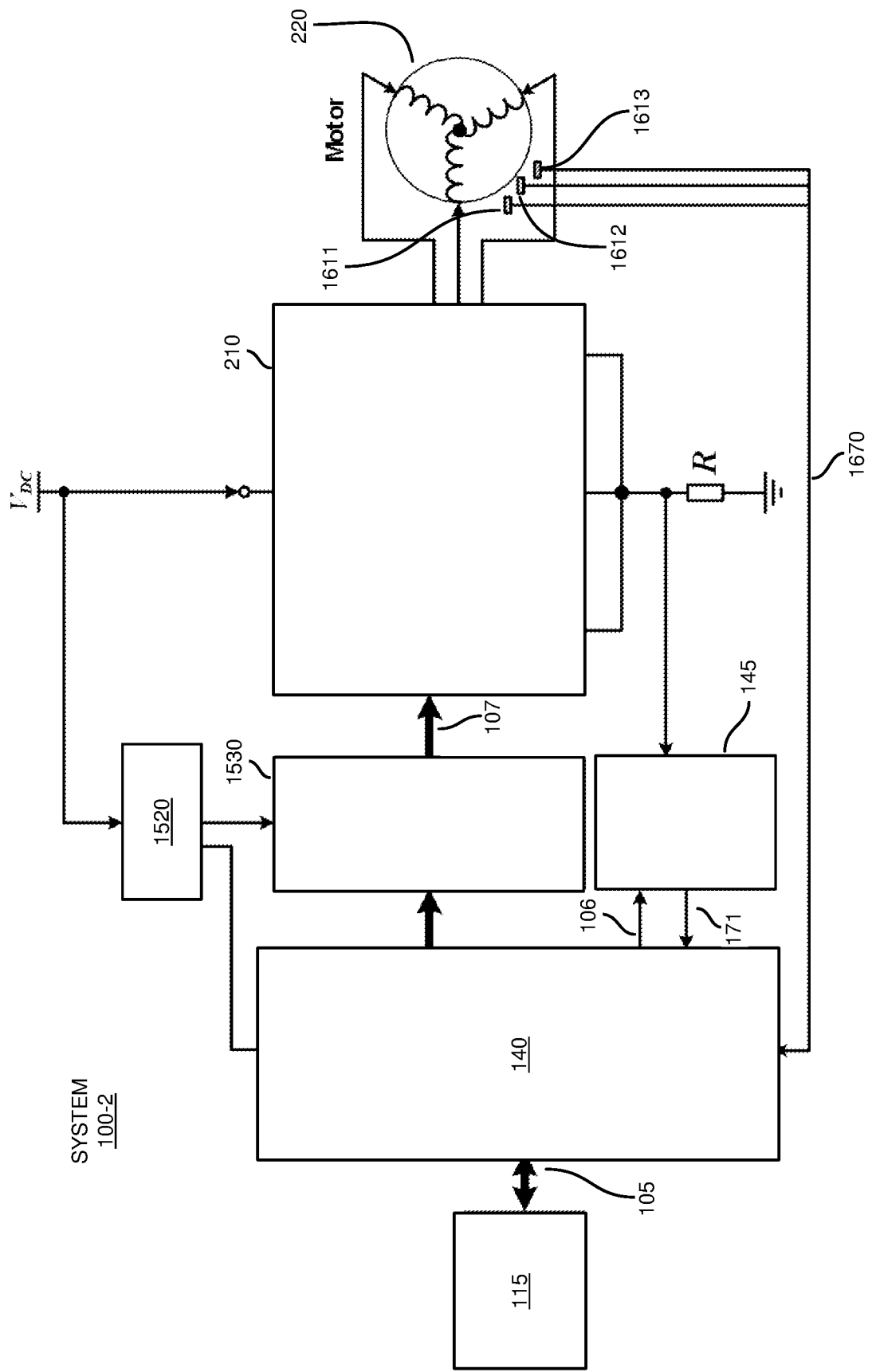
FIG. 16 is an example diagram illustrating a system of controlling and monitoring current through multiple windings in a motor system according to embodiments herein.

FIG. 16 is an example diagram illustrating a system of controlling and monitoring current through multiple windings in a motor system according to embodiments herein.

In this example embodiment, the motor 220 includes hall sensors 1611, 1612, and 1613, feedback 1670 of which is communicated to the controller 140. In a manner as previously discussed, the amplifier gains as indicated by control signal 106 are adjusted on-the fly by the controller 140 in a manner as previously discussed.

Figure 17:
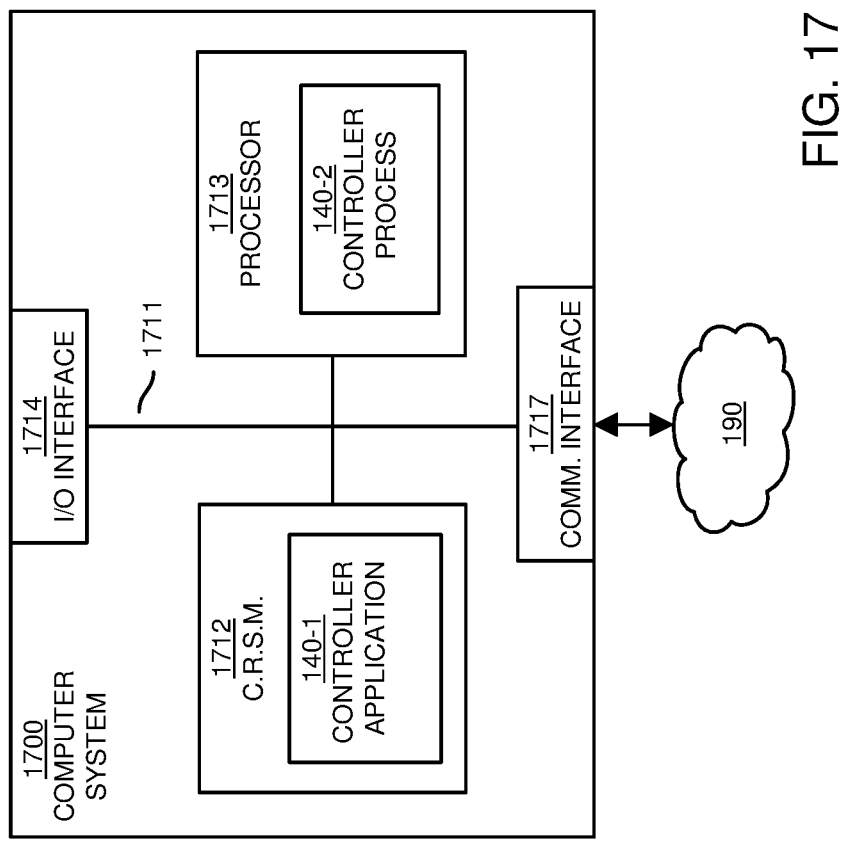
FIG. 17 is an example diagram illustrating computer processor hardware and related software instructions that execute methods according to embodiments herein.

FIG. 17 is an example block diagram of a computer device for implementing any of the operations as discussed herein according to embodiments herein.

As shown, computer system 1700 (such as implemented by any of one or more resources such as controller 140, user interface 115, amplifier 145, etc.) of the present example includes an interconnect 1711 that couples computer readable storage media 1712 such as a non-transitory type of media (or hardware storage media) in which digital information can be stored and retrieved, a processor 1713 (e.g., computer processor hardware such as one or more processor devices), I/O interface 1714, and a communications interface 1717.

I/O interface 1714 provides connectivity to any suitable circuitry or component such as user interface 115, winding 131, amplifier 145, etc.

Computer readable storage medium 1712 can be any hardware storage resource or device such as memory, optical storage, hard drive, floppy disk, etc. In one embodiment, the computer readable storage medium 1712 stores instructions and/or data used by the controller application 140-1 to perform any of the operations as described herein.

Further in this example embodiment, communications interface 1717 enables the computer system 1700 and processor 1713 to communicate over a resource such as network 190 to retrieve information from remote sources and communicate with other computers.

As shown, computer readable storage media 1712 is encoded with controller application 140-1 (e.g., software, firmware, etc.) executed by processor 1713. Controller application 140-1 can be configured to include instructions to implement any of the operations as discussed herein.

During operation of one embodiment, processor 1713 accesses computer readable storage media 1712 via the use of interconnect 1711 in order to launch, run, execute, interpret or otherwise perform the instructions in controller application 140-1 stored on computer readable storage medium 1712.

Execution of the controller application 140-1 produces processing functionality such as controller process 140-2 in processor 1713. In other words, the controller process 140-2 associated with processor 1713 represents one or more aspects of executing controller application 140-1 within or upon the processor 1713 in the computer system 1700.

In accordance with different embodiments, note that computer system 1700 can be a micro-controller device, logic, hardware processor, hybrid analog/digital circuitry, etc., configured to control a power supply and perform any of the operations as described herein.

Functionality supported by the different resources will now be discussed via flowchart 1700 in FIG. 17. Note that the steps in the flowcharts below can be executed in any suitable order.

Figure 18:
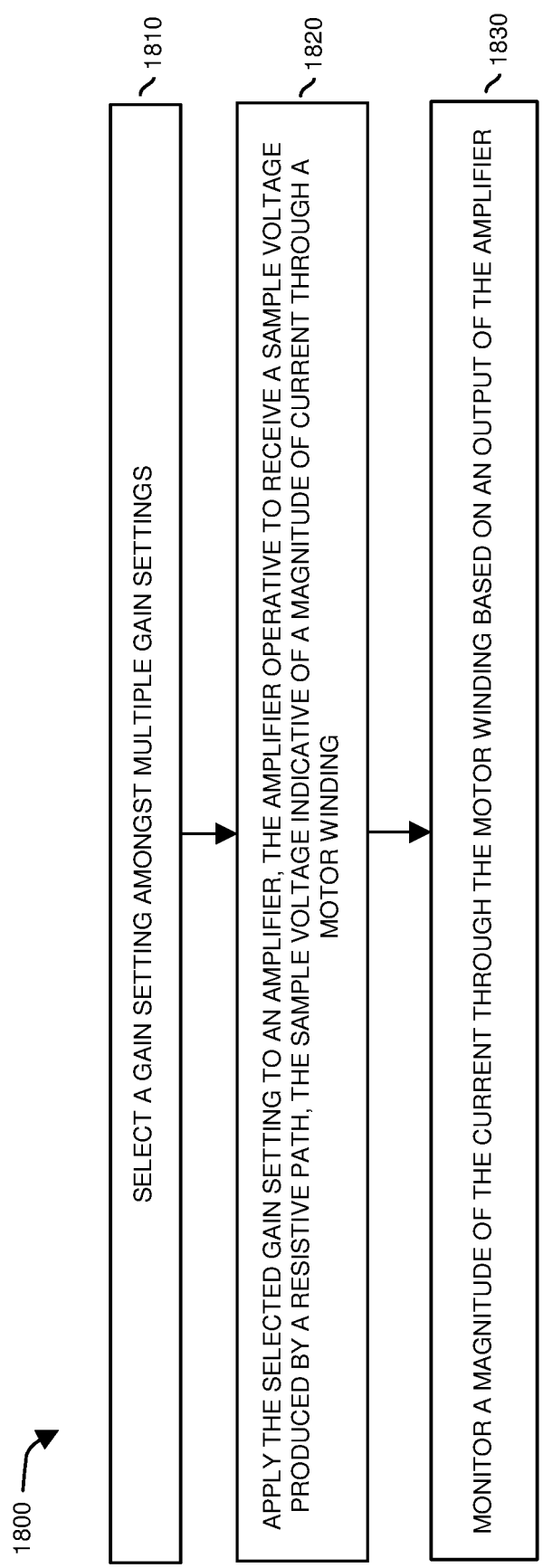
FIG. 18 is an example diagram illustrating a method according to embodiments herein.

FIG. 18 is an example diagram illustrating a method of controlling a power converter according to embodiments herein.

In processing operation 1810 of flowchart 1800, the controller 140 selects a gain setting (such as Gx) amongst multiple gain settings 150.

In processing operation 1820, the controller 140 applies the selected gain setting to an amplifier 145; the amplifier 145 receives a sample voltage 137 produced by a resistive path 135. The sample voltage 137 indicates a magnitude of current 121 through winding 131.

In processing operation 1830, the controller 140 monitors a magnitude of the current 121 through the winding 131 based on an output 147 (such as feedback) of the amplifier 145.

Figure 19:
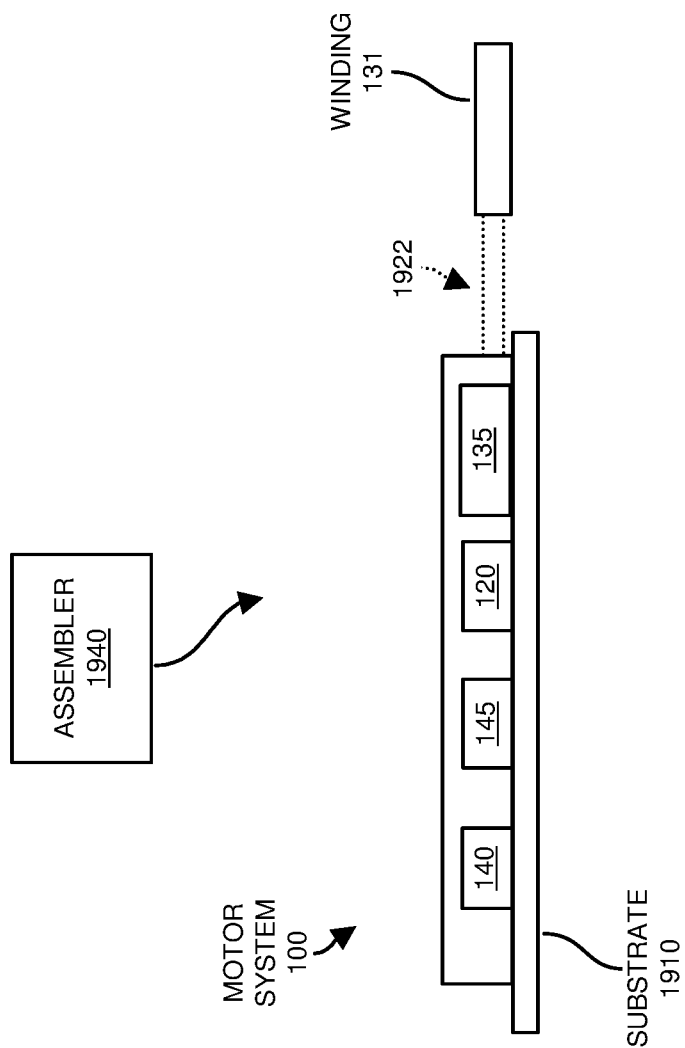
FIG. 19 is an example diagram illustrating assembly of a circuit according to embodiments herein.

FIG. 19 is an example diagram illustrating assembly of a control system (such as a circuit) according to embodiments herein.

In this example embodiment, assembler 1940 receives a substrate 1910 and corresponding components of system 100 such as one or more of controller 140, amplifier 145, switch 120, resistive path 135, etc. The assembler 1940 affixes (couples) the controller 140 and other components such as amplifier 145, switch 120, resistive path 135, etc., to the substrate 1910.

Via one or more respective circuit paths (such as traces, cables, wiring, etc.) as described herein, the fabricator 1940 provides connectivity between one or more components such as controller 140, amplifier 145, switch 120, resistive path 135, etc. Note further that components such as the controller 140, amplifier 145, switch 120, resistive path 135, etc., can be affixed or coupled to the substrate 1910 in any suitable manner. For example, one or more of the components in motor system 100 can be soldered to the substrate 1910, inserted into sockets disposed on the substrate 1910, etc.

Additionally, the substrate 1910 is optional. Any of one or more circuit paths or connectivity as shown in the above drawings and as described herein can be disposed in cables, flexible substrates, or other suitable media.

In one nonlimiting example embodiment, the load (such as one or more windings) is disposed on its own assembly independent of substrate 1910; the substrate of the load (such as motor) is directly or indirectly connected to the substrate 1910 via wires, cables, links, etc. The controller 140 or any portion of the motor system 100 can be disposed on a standalone smaller board plugged into a socket of the substrate 1910 as well.

As previously discussed, via one or more circuit paths 1922 (such as one or more traces, cables, connectors, wires, conductors, electrically conductive paths, etc.), the assembler 1940 couples the system 100 and corresponding components to the winding 131. In one embodiment, the circuit path 1922 conveys current from an input voltage (supply voltage) to the winding 131 as controlled by switch 120.

Accordingly, embodiments herein include a system comprising: a substrate 1910 (such as a circuit board, standalone board, mother board, standalone board destined to be coupled to a mother board, host, etc.); a system 100 including corresponding components as described herein; and at least one winding (such as a motor, winding, etc.).

Note again that techniques herein are well suited for use in circuit applications such as those that implement more precise current monitoring and control. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier; and
  iv) decrease a magnitude of the selected gain of the amplifier in response to detecting an increase in the magnitude of the current through the motor winding.

2. The apparatus as in claim 1, wherein the controller is further operative to vary the selected gain of the amplifier depending on the magnitude of the current being supplied by the motor winding through the resistive path.

3. The apparatus as in claim 1, wherein the resistive path is a resistor disposed in series with the motor winding.

4. The apparatus as in claim 1, wherein the controller is further operative to control operation of a switch disposed in series with the motor winding, the resistive path being an ON resistance between nodes of the switch through which the current passes.

5. The apparatus as in claim 1,
wherein the controller is further operative to increase the magnitude of the selected gain of the amplifier in response to detecting a decrease in the magnitude of the current through the motor winding.

6. The apparatus as in claim 1, wherein the motor winding is a first motor winding of multiple motor windings of a motor;
wherein the controller is further operative to:
  i) control current through each of the multiple motor windings,
  ii) apply a respective selected gain setting to each of multiple amplifiers, the respective selected gain setting being chosen from the multiple gain settings; and
  iii) via amplification of a respective sample voltage via the selected gain setting, monitor a magnitude of respective current through each of the motor windings.

7. The apparatus as in claim 1, wherein the controller is further operable to: select the gain setting amongst multiple gain settings based on a first range in which the magnitude of the current falls.

8. The apparatus as in claim 7, wherein the selected gain setting is decreased in response to the controller detecting that the magnitude of the current changes to falling in a second range of the multiple ranges.

9. The apparatus as in claim 1, wherein the controller is further operable to control operation of a switch to control the magnitude of the current through the motor winding, the switch disposed in series with the motor winding.

10. The apparatus as in claim 1, wherein the motor winding is a first motor winding of a motor; and
wherein at least a portion of the current through the first motor winding flows through a second motor winding of the motor.

11. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of the magnitude of current through a motor winding;
  iii) monitor the magnitude of the current through the motor winding based on an output of the amplifier; and
  wherein the controller is further operative to control the magnitude of the current through the motor winding via control input received from a user operating a tool including the motor winding.

12. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier; and
  wherein the controller is further operative to: i) receive a current limit value indicating a maximum amount of current in which to drive the motor winding, and ii) select the gain setting of the amplifier depending on the current limit value.

13. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier; and
    wherein the controller is further operative to: adjust the gain of the amplifier depending on an operational range in which the current through the motor winding is selectable via a respective user.

14. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier;
wherein the controller is operable to increase a gain of the amplifier in response to detecting a decreased operational range of selectively controlling the current through the motor winding; and
wherein the controller is operable to decrease a gain of the amplifier in response to detecting an increased operational range of selectively controlling the current through the motor winding.

15. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier;
  wherein the amplifier is a first amplifier coupled to receive the sample voltage from the first resistive path; and
wherein the controller is further operative to: i) apply a first gain to the first amplifier and a second gain to a second amplifier coupled to receive the sample voltage from the resistive path, and ii) select between an output of the first amplifier and an output of the second amplifier to determine the magnitude of the current.

16. An apparatus comprising:
a controller operative to:
  i) select a gain setting amongst multiple gain settings;
  ii) apply the selected gain setting to an amplifier, the amplifier operative to receive a sample voltage produced by a resistive path, the sample voltage indicative of a magnitude of current through a motor winding;
  iii) monitor the magnitude of the current through the motor winding based on an output of the amplifier; and
  wherein the controller is further operative to apply hysteresis between a first gain applied to the amplifier and a second gain applied to the amplifier during operations of measuring different magnitudes of the current.

17. A method comprising:
selecting a gain setting amongst multiple gain settings;
applying the selected gain setting to an amplifier, the amplifier operative to receive a sample voltage produced by a resistive path, the sample voltage indicative of a magnitude of current through a motor winding;
monitoring the magnitude of the current through the motor winding based on an output of the amplifier; and
the method further comprising: decreasing a magnitude of the selected gain of the amplifier in response to detecting an increase in the magnitude of the current through the motor winding.

18. The method as in claim 17 further comprising:
varying the selected gain of the amplifier depending on the magnitude of the current being supplied by the motor winding through the resistive path.

19. The method as in claim 17 further comprising:
controlling the magnitude of the current through the motor winding via control input received from a user operating a tool including the motor winding.

20. The method as in claim 17 further comprising:
receiving a current limit value indicating a maximum amount of current in which to drive the motor winding; and
selecting the gain setting of the amplifier depending on the current limit value.

21. The method as in claim 17, wherein the resistive path is a resistor disposed in series with the motor winding.

22. The method as in claim 17 further comprising:
controlling operation of a switch disposed in series with the motor winding, the resistive path being an ON resistance between nodes of the switch through which the current passes.

23. The method as in claim 17 further comprising:
adjusting the gain of the amplifier depending on a range in which the current through the motor winding is selectable via a respective user.

24. The method as in claim 17 further comprising:
increasing a gain of the amplifier in response to detecting a decreased operational range of selectively controlling the current through the motor winding; and
decreasing a gain of the amplifier in response to detecting an increased operational range of selectively controlling the current through the motor winding.

25. The method as in claim 17 further comprising:
increasing the magnitude of the selected gain of the amplifier in response to detecting a decrease in the magnitude of the current through the motor winding.

26. The method as in claim 17, wherein the motor winding is a first motor winding of multiple motor windings of a motor, the method further comprising:
controlling current through each of the multiple motor windings,
applying a respective selected gain setting to each of multiple amplifiers, the respective selected gain setting being chosen from the multiple gain settings; and
via amplification of a respective sample voltage via the selected gain setting, monitoring a magnitude of respective current through each of the motor windings.

27. The method as in claim 17, wherein the amplifier is a first amplifier coupled to receive the sample voltage from the first resistive path, the method further comprising:
applying a first gain to the first amplifier and a second gain to a second amplifier coupled to receive the sample voltage from the resistive path; and
selecting between an output of the first amplifier and an output of the second amplifier to determine the magnitude of the current.

28. The method as in claim 17 further comprising:
implementing hysteresis between a first gain applied to the amplifier and a second gain applied to the amplifier during operations of measuring different magnitudes of the current.

29. A system comprising:
a circuit substrate;
the apparatus of claim 1 coupled to the circuit substrate; and
wherein the controller controls current supplied to the motor winding.

30. A method comprising:
receiving a circuit substrate; and
coupling the apparatus of claim 1 to the circuit substrate.

* * * * *